(12) United States Patent
Coppola et al.

(10) Patent No.: US 7,528,665 B2
(45) Date of Patent: May 5, 2009

(54) MULTIPLE FREQUENCY SOURCE SYSTEM AND METHOD OF OPERATION

(75) Inventors: Francesco Coppola, Grasse (FR); Stefano Cipriani, Golfe Juan (FR); Lorenzo Carpineto, Antibes (FR); Gianni Puccio, La Gaude (FR); Eric Duvivier, Golfe Juan (FR); Biagio Bisanti, Antibes (FR); Martin Alderton, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 251 days.

(21) Appl. No.: 11/461,530

(22) Filed: Aug. 1, 2006

(65) Prior Publication Data
US 2007/0183014 A1  Aug. 9, 2007

Related U.S. Application Data

(60) Provisional application No. 60/595,754, filed on Aug. 2, 2005, provisional application No. 60/595,750, filed on Aug. 2, 2005, provisional application No. 60/595,749, filed on Aug. 2, 2005.

(51) Int. Cl.
  *H03L 7/00* (2006.01)
(52) U.S. Cl. .......................... 331/2; 331/44
(58) Field of Classification Search .............. 331/44, 331/2
  See application file for complete search history.

(56) References Cited

U.S. PATENT DOCUMENTS 5,452,290 A  9/1995  Mihm
5,565,816 A  10/1996  Coeteus
6,275,990 B1  8/2001  Dapper et al.

(Continued)

FOREIGN PATENT DOCUMENTS

EP  1 045 606  10/2000

(Continued)

OTHER PUBLICATIONS

Vuillod P. et al: "Clock-Skew Optimization for Peak Current Reduction," ISLPED, Proc. of the Int'l Symposium on Low Power Electronics and Design, Aug. 14, 1996, pp. 265-270.

(Continued)

*Primary Examiner*—Joseph Chang
(74) *Attorney, Agent, or Firm*—Clifford Perry; Bruce W. Greenhaus

(57) ABSTRACT

A multiple frequency source system includes at least one frequency source tunable to a predefined target frequency, and at least one additional frequency source operable to generate a second signal at a frequency which is either higher or lower than the target frequency. A method for tuning the tunable frequency source to the target frequency during concurrent generation of the second signal includes (i) controlling the tunable frequency source to tune to at least one frequency point frequency lower than the target frequency, and thereafter controlling the oscillator to tune to the target frequency, when the second signal is higher in frequency than the target frequency, or (ii) controlling the tunable frequency source to tune to at least one frequency point higher than the target frequency, and thereafter controlling the tunable frequency source to tune to the target frequency, when the second signal is lower in frequency than the target frequency.

41 Claims, 20 Drawing Sheets

U.S. PATENT DOCUMENTS

| | | | |
|---|---|---|---|
| 6,304,146 | B1 | 10/2001 | Welland |
| 7,216,249 | B2 * | 5/2007 | Fujiwara et al. ............. 713/501 |
| 2003/0006850 | A1 | 1/2003 | Lye et al. |
| 2004/0156465 | A1 | 8/2004 | Schmandt |
| 2004/0189366 | A1 | 9/2004 | Haringer et al. |

FOREIGN PATENT DOCUMENTS

| | | |
|---|---|---|
| JP | 07-007386 | 10/1995 |
| WO | WO 99/41933 | 8/1999 |
| WO | WO 2004/000822 | 9/2004 |

OTHER PUBLICATIONS

Neves et al. "Buffered Clock Tree Synthesis with Non-Zero Clock Skew Scheduling for Increased Tolerance to Process Parameter Variations," J. of VLSI Signal Proc. Systems for Signal, vol. 16, No. 2/3, Jun. 1997 pp. 149-160.

Courtesy International Search Report for PCT/IB20063/052632 dated Dec. 22, 2006.

Courtesy International Search Report for PCT/IB2006/052633 dated Dec. 22, 2006.

Courtesy International Search Report for PCT/IB2006/052634 dated Jan. 12, 2007.

* cited by examiner

MULTIPLE FREQUENCY SOURCE SYSTEM AND METHOD OF OPERATION

CROSS REFERENCE TO RELATED APPLICATIONS

This patent application is related to, and concurrently filed with each of the following patent applications, the contents of which are herein incorporated by reference for all purposes:

"Offset Signal Phasing for a Multiple Frequency Source System," application Ser. No.11/461,533, and "System and Method for Mitigating Phase Pulling in a Multiple Frequency Source System," application Ser. No. 11/461,534.

This patent application claims priority to, and incorporates in its entirety each of the following U.S. patent applications:

"Multiple Frequency Source System and Method of Operation," application Ser. No. 60/595,754, filed Aug. 2, 2005;

"Offset Signal Phasing for a Multiple Frequency Source System," application Ser. No. 60/595,749, filed Aug. 2, 2005; and "System and Method for Mitigating Phase Pulling in a Multiple Frequency Source System," application Ser. No. 60/595,750, filed Aug. 2, 2005.

BACKGROUND

The present invention relates to frequency source systems, and more particularly to a system employing multiple frequency sources operable to enable the generation of multiple signal frequencies concurrently.

Frequency sources are used in communication systems to perform a myriad of signal processing operations such as frequency translation, signal modulation/demodulation, system clock generation, as well as other processes. Frequency sources are used in other applications as well when the generation of a known reference signal is needed.

Frequency sources generally are of two types, fixed frequency sources operable to generate an output signal at one frequency, and tunable frequency sources which can be controlled to generate an output signal at multiple frequencies over a predefined frequency spectrum. L-C oscillators, crystal oscillators, and dielectric resonator oscillators are exemplary of conventional fixed frequency sources, and voltage controlled oscillators and phase locked loop circuits represent well-known tunable frequency sources.

Communication systems, as well as other systems could benefit from the use of multiple frequency signals, as multiple processes could be performed concurrently in such an instance, for example. However, the implementation of a system operable to generate concurrent, multiple frequency signals is difficult, as concurrently-generated signals will interact with each other if tuned too closely together. Interaction between the differing signals can results in degradation of each signal, possibly rendering the signal unusable for their intended purpose.

What is needed is a multiple frequency source system and method of operation which permits the concurrent generation of two or more frequencies while minimizing the interaction between the concurrently operating signals.

SUMMARY

The present invention provides a multiple frequency source system and method for generating two or more frequency signals while minimizing the signal interaction therebetween. The presented system is tunable, having at least one frequency source which can be tuned proximate to a concurrently-operating frequency.

In one of various embodiments of the invention set forth herein, a multiple frequency source system is presented that includes at least one frequency source tunable to a predefined target frequency, and at least one additional frequency source operable to generate a second signal at a frequency which is either higher or lower than the target frequency. A method for tuning the tunable frequency source to the target frequency during concurrent generation of the second signal includes (i) controlling the tunable frequency source to tune to at least one frequency point lower than the target frequency, and thereafter controlling the tunable frequency source to tune to the target frequency, when the second signal is higher in frequency than the target frequency, or (ii) controlling the tunable frequency source to tune to at least one frequency higher than the target frequency, and thereafter controlling the tunable frequency source to tune to the target frequency, when the second signal is lower in frequency than the target frequency.

These and other features of the invention will be better understood when read in view of the following drawings and detailed description.

For clarity, previously-identified features retain their reference indicia in subsequent drawings.

DESCRIPTION OF EXEMPLARY EMBODIMENTS

The present invention provides systems and methods for operating multiple frequency sources within the same signal spectrum with the capability to tune to a desired (target) frequency without disturbing the operation of one or more existing frequencies generated within the spectrum. The required proximity between the target frequency and the existing signal(s) will depend upon system parameters, for example the required stability of the existing frequency, the range over which the source tuning to the target frequency must travel to reach the target frequency. The present invention is advantageously used in any system in which tuning to a target frequency is desired during the concurrent generation of another frequency within the operating frequency spectrum of the system.

Figure 1A:
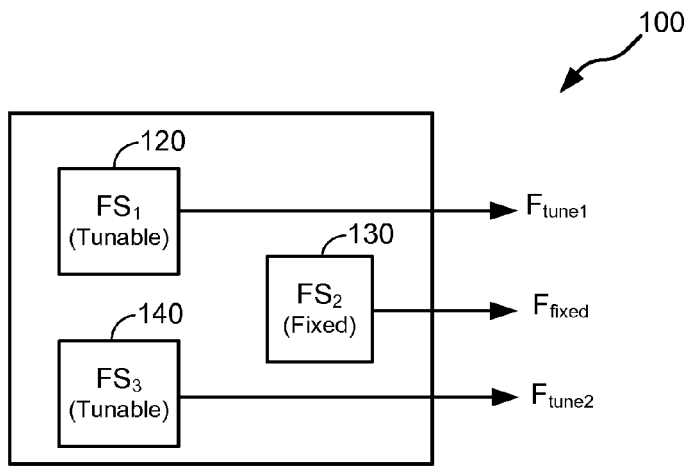
FIG. 1A illustrates an exemplary system employing multiple frequency sources in accordance with the present invention.

FIG. 1A illustrates an exemplary embodiment of a system employing currently operable frequency sources in accordance with the present invention. As shown, the tunable system 100 includes three frequency sources $FS_1$ 120, $FS_2$ 130 and $FS_3$ 140, at least one of which (e.g., $FS_1$ 120) is tunable. The remaining frequency sources may be operable to generate a fixed frequency or a tunable frequency, as required or desired by the system's design.

In an exemplary embodiment of the invention, a frequency source, e.g., 120, is tuned to a particular target frequency. As further described below, the process by which frequency source 120 tunes to the target frequency will depend upon the presence and proximity of any existing frequencies. In particular, tuning processes are described in which (i) the target frequency is presently the only generated frequency, (ii) the target frequency is located below the lowest existing frequency, (iii) the target frequency is located above the highest existing frequency, and (iv) the target frequency is located between two existing frequencies. Each of these tuning processes is described in detail below.

Figure 1B:
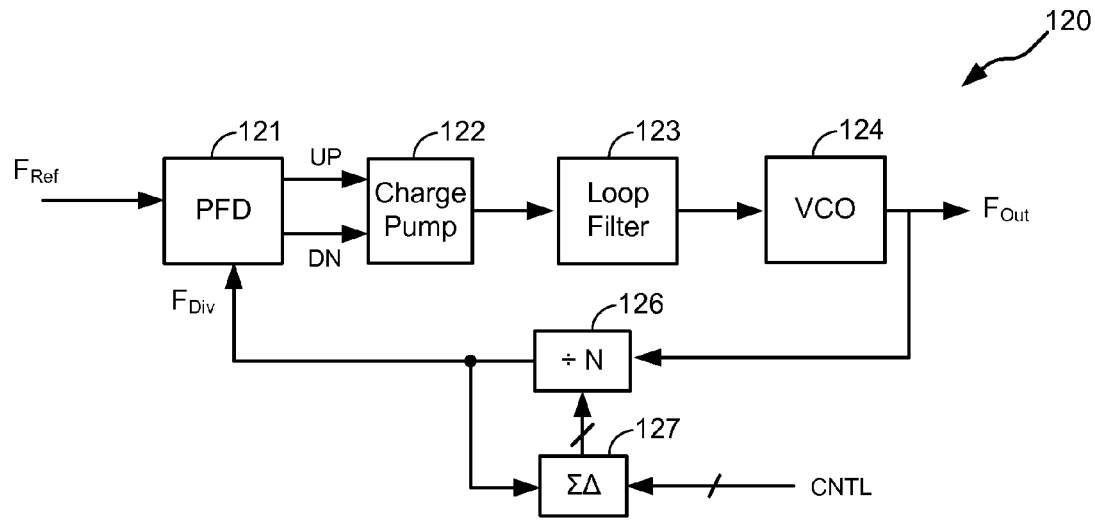
FIG. 1B illustrates an exemplary frequency source in accordance with the present invention.

FIG. 1B illustrates an exemplary embodiment of the tunable frequency source 120 shown in FIG. 1A. As shown, the tunable source 120 is implemented as a phase locked loop (PLL), which may be monolithically fabricated in a bipolar complementary metal oxide semiconductor (Bi-CMOS) process, although those of skill in the art will appreciate that the circuit may be formed using other processes or materials (e.g., CMOS, SiGe, GaAs) in monolithic, hybrid, or discrete form. In a particular embodiment of the invention, two or more (e.g., 3, 5, 10, 100 or more) PLLs are implemented in a system to provide a respective two or more tunable, synthesized frequencies within the same operating spectrum (e.g., a synthesized frequency spectrum covering 500 MHz-10 GHz). The tunable source(s) may be implemented in other forms, such as a variable oscillator, a digitally controlled oscillator, and the like. Alternative to an all-tunable frequency source design, one or more fixed frequency source may be used, exemplary oscillators being in the form of L-C oscillators, crystal oscillators, dielectric resonator oscillators, and the like. In a similar vein, the tunable source(s) may be of another construction, such as a variable oscillator design, digitally controlled oscillator, and the like. Those skilled in the art will appreciate that the systems and methods of the present invention are not limited to any particular design or construction of the frequency source, tunable or fixed.

In the exemplary embodiment shown, the PLL 120 includes a phase-frequency detector 121 operable to compare the phase and frequency of a received reference signal $F_{Ref}$ to a divided down version of the output frequency $F_{Div}$, the output of the phase-frequency detector being a signal (voltage or charge) representative of the difference between $F_{Ref}$ and $F_{Div}$. In a particular embodiment of the invention, the phase-frequency detector 121 includes a direction control circuit to facilitate signal locking. An exemplary embodiment of the direction control circuit is illustrated in FIG. 13. As an alternative to the phase-frequency detector 121, a less complex phase detector may be employed as well.

In some embodiments, the PLL further includes a charge pump 122 operable to provide frequency control responsive to the output of the phase-frequency detector. Frequency control is provided by means of the charge pump either supplying current to or drawing current from the loop filter, these conditions providing a change in the voltage at the input of a voltage-controlled oscillator (VCO) 124, the change in voltage resulting in a decrease or increase in the VCO's output frequency $F_{Out}$. When, for example, the UP signal is in a high state and the DN signal is in a low state, the oscillator is controlled to increase its output frequency. When the UP signal is in a low state and the DN signal is in a high state, the input voltage of the oscillator is controlled to decrease its output frequency. In an alternative embodiment, the charge pump 122 is omitted, and the UP/DN signals are generated from the phase-frequency detector 110 itself.

The PLL further includes a loop filter 123 operable to receive and filter the charge pump UP and DN signals, thereby reducing noise and spurious product content of the loop signal. The loop filter 123 may passive or active, a typical embodiment of the latter employing an operational amplifier, or similar functional device. In a specific embodiment of the invention, the loop filter 123 is operable in several different modes, including a normal mode in which the oscillator is tuning freely, a pre-charge mode in which the filter's initial operating condition (e.g., voltage) is controllably set, a voltage read mode in which the tuning voltage of the oscillator is read, and a low frequency overshoot mode, in which the frequency overshoot of the phase locked loop is minimized. An exemplary embodiment of the multi-mode loop filter is presented below in FIG. 11. Alternative embodiments of the invention may employ a conventional loop filter known in the art.

Figure 10:
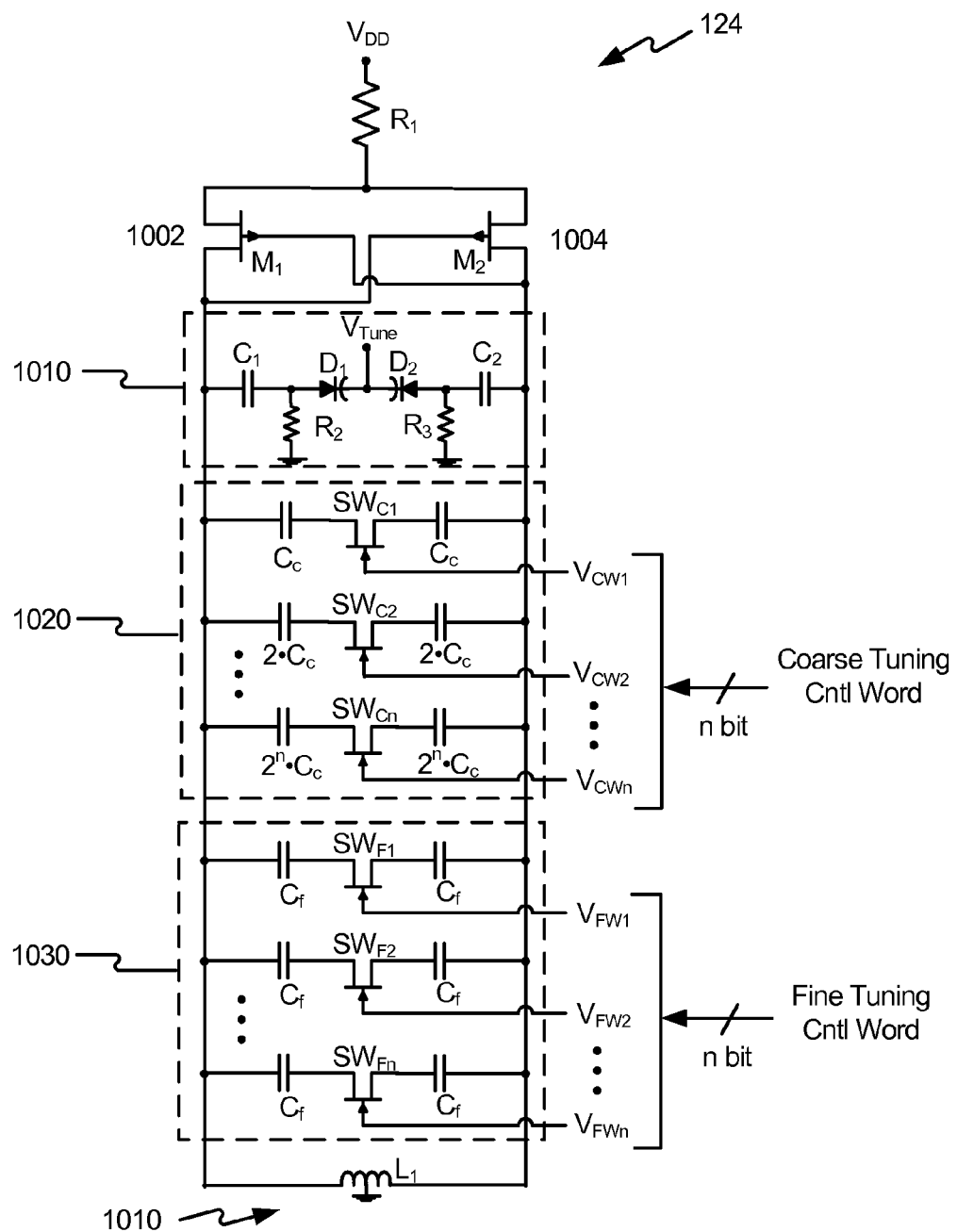
FIG. 10 illustrates an exemplary embodiment of an oscillator in accordance with the present invention.

The loop filter output signal is supplied to an oscillator 124, illustrated as a voltage controlled oscillator (VCO) in an exemplary embodiment. In a particular embodiment of the invention, oscillator 124 is included within a VCO bank, selection from which is defined by a particular oscillator selection process, which is further described below. In alternate embodiment of the invention, the oscillator 124 is a conventional VCO implemented either singly, or within a bank of VCOs as these features are known in the art. Other oscillators, such as digitally controlled oscillators may be employed alternatively in the present invention. Responsive to the supplied loop filter signal, the oscillator 124 generates a signal at frequency $F_{Out}$. An exemplary embodiment of the oscillator 124 is illustrated in FIG. 10 below. Of course, various types of oscillators may be used. Those skilled in the art will appreciate that the invention is not limited to any particular oscillator design.

A portion of the output signal FRef is fed back to a divide-by-N counter 126, which is operable to divide down the output frequency by a particular amount N or fraction thereof. The divide-by-N counter 126 may be an integer or fractional N counter, as well as implement a sigma-delta modulator 127 to provide a sigma-delta PLL design to provide a smaller dividing ratio and greater tuning resolution. The divided down signal FDiv is subsequently provided to the phase-frequency detector which continues comparing the phase and frequency of the divided down signal and reference signals $F_{Div}$ and $F_{Ref}$ to generate an output signal. Furthermore, all or any portion of the loop's signal path may be of a single-ended or differential design.

I. Exemplary Tuning and System Processes

Figure 2:
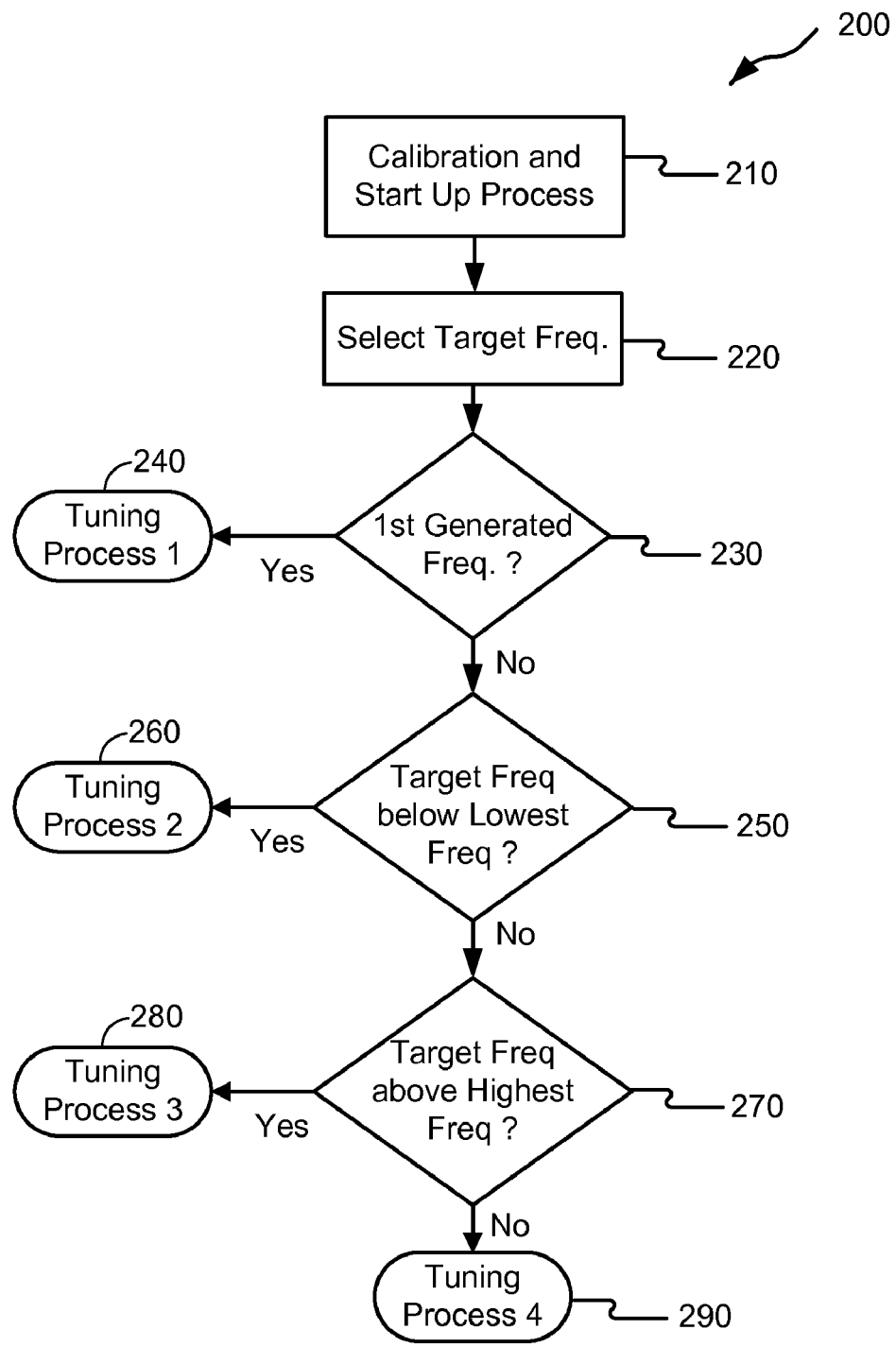
FIG. 2 illustrates an exemplary method for tuning one of the frequency sources to a target frequency in a multiple frequency source system in accordance with the invention.
Figure 3A:
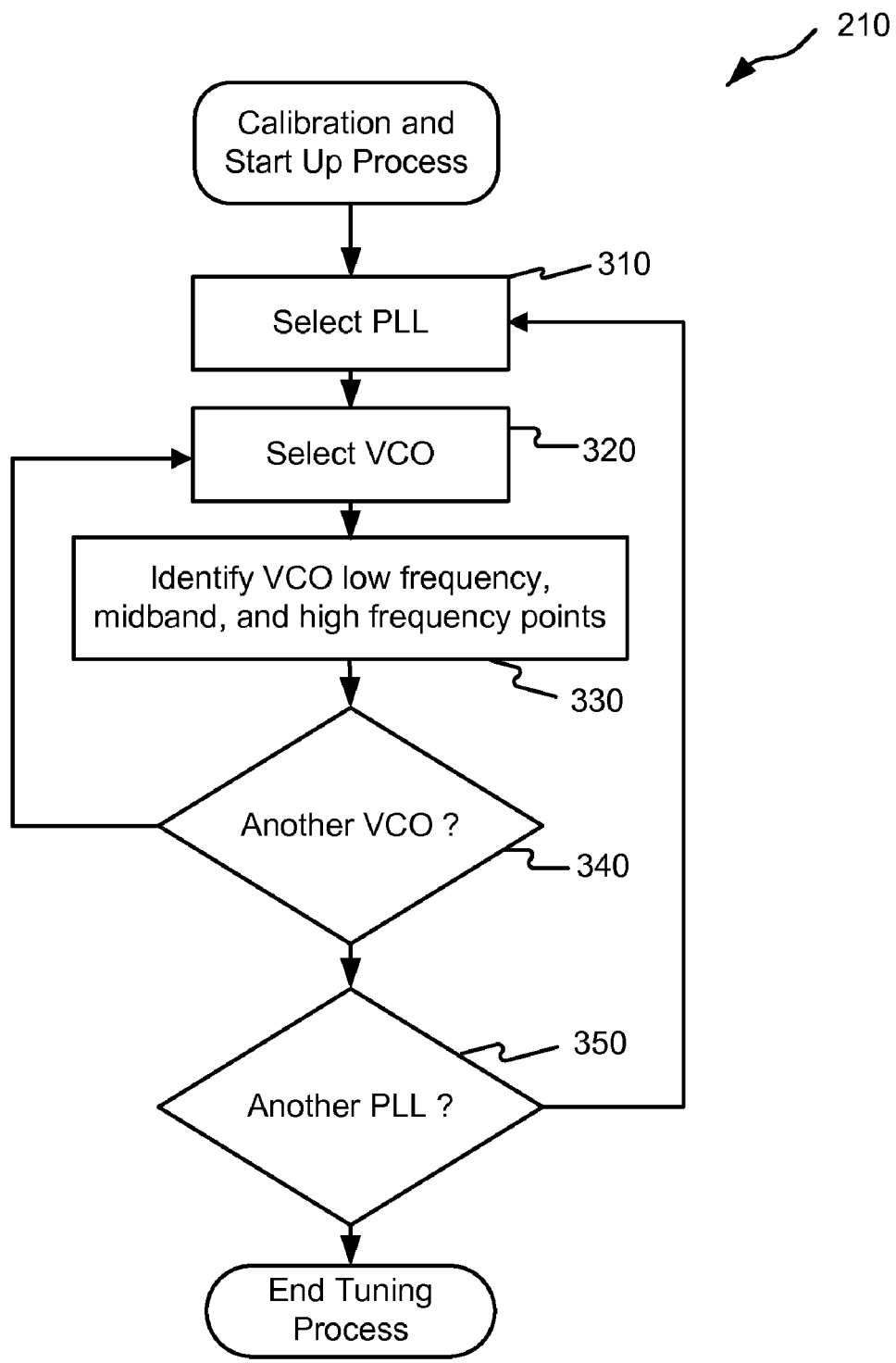
FIG. 3A illustrates an exemplary embodiment of a start-up and calibration process in accordance with the present invention.

FIG. 2 illustrates an exemplary method for tuning one of the frequency sources to a target frequency in a multiple frequency source system in accordance with the invention. The method 200 includes a calibration and start-up process 210 operable to establish ranges for each of the oscillators employed within each of the frequency sources. In a particular embodiment of the invention, each frequency source is a tunable PLL frequency source, each PLL having multiple VCOs as its oscillators. In an alternative embodiment, the system may include a tunable source of a different construction, or having perhaps only one oscillator. In still a further embodiment, the system may include one or more fixed frequency sources, each having a single oscillator. An exemplary embodiment of the calibration and start-up process 210 is illustrated in FIG. 3A below.

Figure 4:
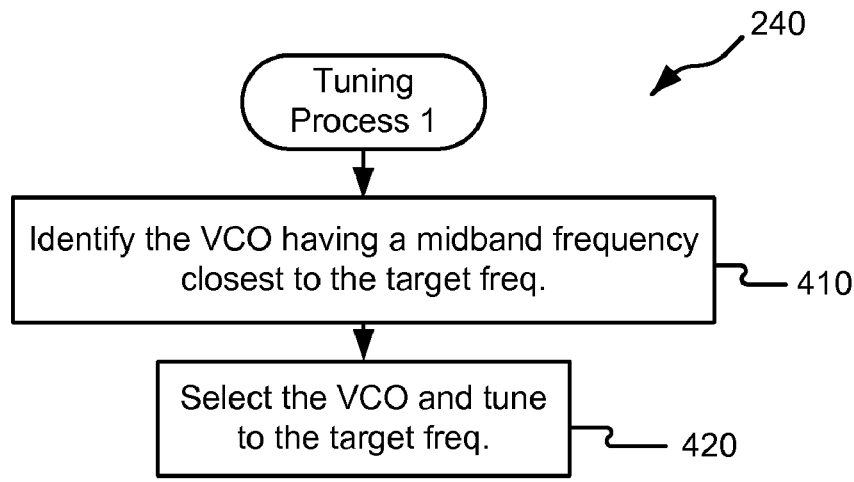
FIG. 4 illustrates an exemplary embodiment of a tuning process in which the requested target frequency is the first generated frequency in accordance with the present invention.

Subsequent to calibration and start-up processes, a request to operate a signal at a particular target frequency is received at 220. At 230, a determination is made as to whether any other signals are being concurrently generated by the other frequency sources in the system. If no other signals are being produced, the process continues at 240 where an appropriate oscillator is selected and the signal generated at the requested target frequency. FIG. 4 further illustrates an exemplary embodiment of this process.

If one or more frequency sources are presently operating, the process continues at 250, where a determination is made as to whether the requested target frequency is below the lowest generated frequency. If so, the process continues at 260 in which an appropriate oscillator is selected and the signal generated at the target frequency. An exemplary embodiment of this process is further described in FIG. 5A below.

If the target frequency is not below the lowest generated frequencies, the process continues at 270 where a determination is made as to whether the target frequency is above the highest generated frequency. If so, the process continues at 280 whereby an appropriate oscillator is selected and a signal generated at the requested target frequency. An exemplary embodiment of this process is further illustrated in FIG. 6A below.

If the target frequency is not above the highest generated frequencies, the requested target frequency is located between two generated frequencies. The process continues at 290 where an appropriate oscillator is selected and a signal generated at the requested target frequency, an exemplary process of which is described in FIG. 7A below.

FIG. 3A illustrates an exemplary embodiment of a start-up and calibration process in accordance with the present invention. The exemplary embodiment shows each of the frequency sources as phase locked loop circuits (PLL), each PLL employing two or more voltage controlled oscillators (VCOs) to collectively provide a total tuning range over which the particular PLL generates its output frequency. Those skilled in the art will appreciate that only one of the frequency sources need be tunable, and that other tunable or fixed frequency sources may be used in alternative embodiments of the invention.

The process begins at 310 where one of the plurality of PLLs are selected, and at 320, one of its corresponding VCOs are activated. After selection, the VCO is tested at 330 to determine its lowest frequency operating point, a midband frequency point, and its highest frequency operating point. The process continues at 340 in which the next (if any) VCO is selected, and the processes of 320-330 are repeated therefor. When no further VCOs for the selected PLL remain, another PLL is selected at 350 and its corresponding VCO(s) are activated for determining their corresponding lowest, midband and highest operating frequency points. When no further PLLs remain, the start and calibration process concludes. Similar operations may be performed for other tunable frequency sources, as well as fixed frequency sources. For example in the latter, process 330 can be omitted, since the oscillator of the fixed frequency source would typically not include low, midband, and high frequency points. Further, the process of 340 can be omitted for fixed or tunable frequency sources employing a single oscillator. Other modifications will be apparent to the skilled person.

In a particular embodiment of the invention, the VCO's operating frequency is controlled digitally through the use of coarse and fine tuning words supplied to the VCO. In one exemplary embodiment, the coarse tuning word ranges from a value of 0 to 31, zero representing the highest operating VCO frequency, and thirty-one representing the lowest VCO operating frequency. In such an embodiment, the aforementioned process of 330 of identifying a VCO low frequency, midband and high frequency point is performed by supplying control words of values 31, 15, and 0, respectively, and recording the locked frequency at a predefined frequency, for instance at 1.5 V representing the center of the VCO's linear-most tuning range. Those skilled in the art will appreciate that the VCOs frequency may be set using analog voltages, or a digital word of shorter or longer length may be used in alternative embodiments under the present invention.

Figure 3B:
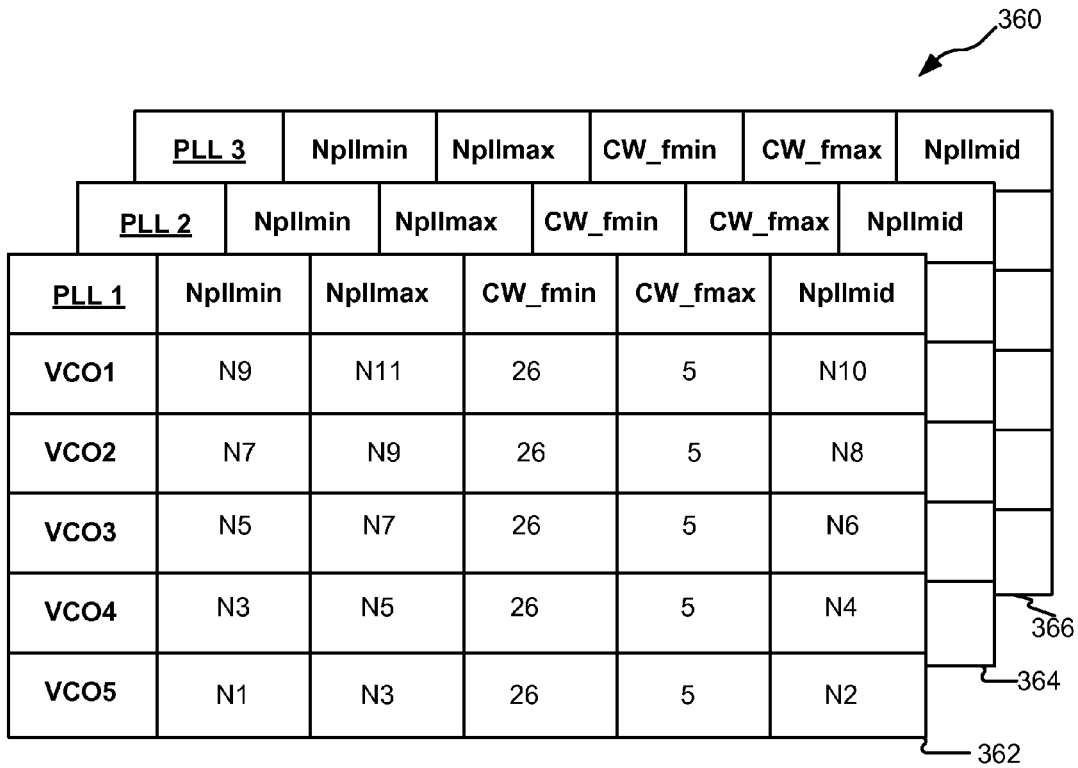
FIG. 3B illustrates an exemplary data structure operable to store operating frequency points for a plurality of oscillators within a phase locked loop frequency source in accordance with the present invention.

FIG. 3B illustrates an exemplary data structure operable to store operating frequency points for a plurality of oscillators within a PLL frequency source in accordance with the present invention. The described embodiment illustrates a total of three PLLs, each PLL having five VCOs. Of course, another arrangement as to the number of PLLs and the number of VCOs per PLL may be used in alternative embodiments under the present invention. Further as mentioned above, frequency sources other than PLLs may be implemented in alternative embodiments under the present invention.

In the exemplary embodiment, the vco_freq data structure 360 includes three pages 362, 364, and 366, each page corresponding to one PLL. Each data structure page lists a divider ratio Npll corresponding to the lowest, midband, and highest operating frequency points of each of the five VCOs, these quantities labeled as Npllmin, Npllmax, and Npllmid, respectively. Each VCO is operable to provide tuning over a particular frequency band, all collectively providing a total tuning range for the particular PLL.

In addition, each page includes digital coarse tuning words ("coarse words" or "CW" herein) CW_fmin and CW_max corresponding, respectively, to the lowest and highest operating frequency of the particular VCO. Coarse words CW_fmin and CW_fmax are digital control signals, which, when supplied to the VCO, control the VCO to tune to the lowest and highest frequency. Parameter Npllmid corresponds to the resulting divider ratio when the particular VCO is supplied coarse word representing the midband point, which is 15 in the illustrated embodiment.

In the data structure shown, the lowest VCO operating frequency is identified with a coarse word CW_fmin of value 25 instead of 31, and the highest VCO operating frequency CW_fmax is identified with a value 5 instead of 0, thereby providing some margin for overlap between adjacent VCOs. The actual highest and lowest tuning point of each VCO can be interpolated from the coarse words when the tuning range per coarse word increment in known; for example if it is known that CW_fmin of VCO 1 is 25 and that coarse word corresponds to a frequency of 4,000 MHz, and it is further known that the VCO tunes over 400 MHz over 32 coarse word increments, then it can be determined that each coarse word increment will provide approximately 12.5 MHz of tuning range. Accordingly, although VCO1 is tuned to 4000 MHz at CW 25, it is able to tune to 6×12.5 MHz, or 75 MHz lower in frequency, thereby overlapping the high end of the tuning range of VCO 2. In this manner, adjacent VCOs can be designed to provide overlap in their tuning frequency range to ensure gap-free tuning capability with process, temperature, operating or other variations.

Figure 3C:
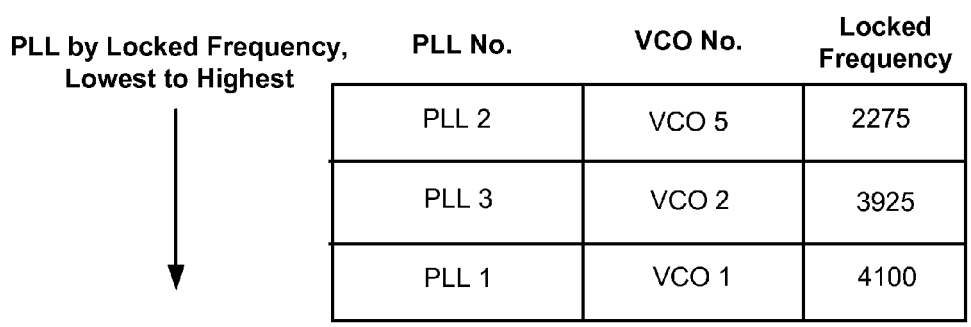
FIG. 3C illustrates an exemplary data structure operable to store presently-generated frequency information in accordance with the present invention.

FIG. 3C illustrates an exemplary data structure operable to store presently generated frequency information in accordance with the present invention. The already_generated data structure 370 includes information as to the presently generated or locked frequency (if any) of the PLLs, the PLL providing the locked frequency, and the VCO within the PLL employed to provide the locked frequency. In a particular embodiment, PLL and VCO information pertaining to the lowest generated frequency is listed first, and the highest generated frequency last. In a further exemplary embodiment, when a PLL does not produce an output frequency, it's generated frequency is displayed as a frequency outside of the stored frequency of operation, for example 0 or 5000 MHz, when no PLL is operable to produce a signal at this frequency. Further particularly, the data structure 370 is updated and re-ordered when a generated signal changes frequency, is activated, or de-activated.

Target Frequency is First Locked Frequency

FIG. 4 illustrates an exemplary embodiment of the tuning process 240 in which the requested target frequency is the first generated frequency (or "locked" frequency in the case of a PLL-generated signal) in accordance with the present invention. When the multiple frequency source system presently generates no other signals, the oscillator selection process includes identifying an oscillator, e.g. a VCO, having a midband frequency point closest to the target frequency (410). The identified VCO is activated and permitted to tune and lock to the requested target frequency at 420.

Target Frequency Located Below Lowest Locked Frequency

Figure 5A:
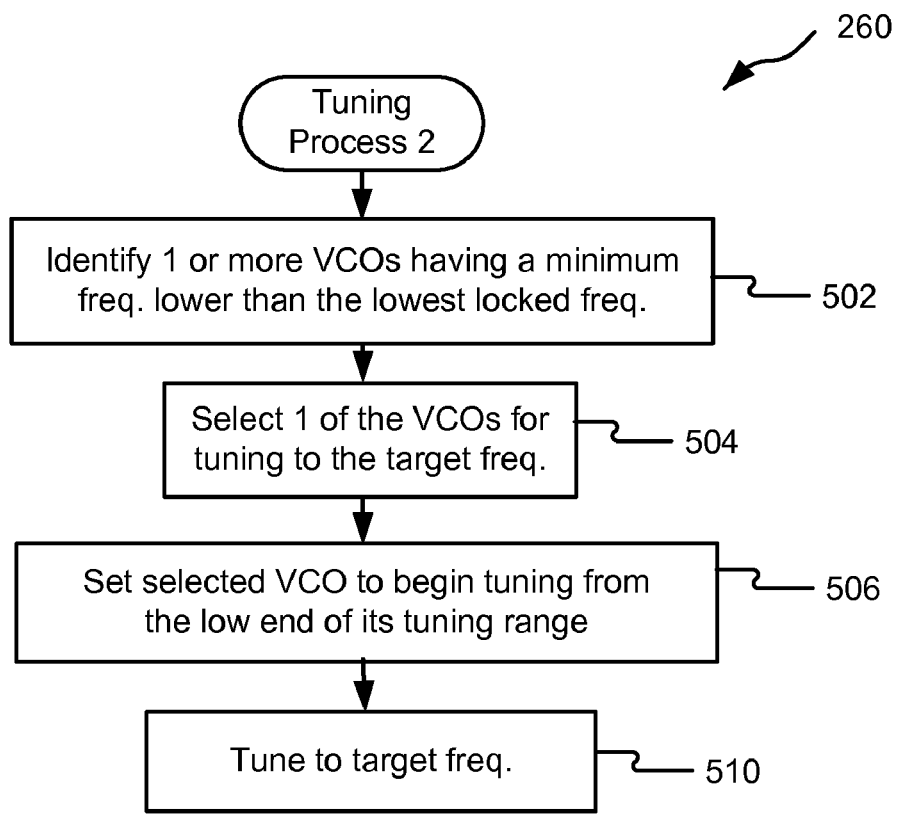
FIG. 5A illustrates an exemplary embodiment of a tuning process in which the requested target frequency is lower than the lowest generated frequency in accordance with the present invention.

FIG. 5A illustrates an exemplary embodiment of a tuning process 260 in which the requested target frequency is lower than the lowest generated frequency in accordance with the present invention. In a particular embodiment of the invention, VCO tuning to the target frequency occurs by approaching the target frequency from the below the second (existing) frequency, without crossing the existing frequency.

The process begins at 502 whereby one or more oscillators (e.g., a VCO) having a minimum frequency lower than the lowest generated/locked frequency are identified. At 504, one of the identified VCOs is selected for tuning to the target frequency. The selection process may involve various factors, including which of the selected VCOs, when tuned to the target frequency, will be closest to, or within the linear-most tuning range, and which selected VCO can be activated at a frequency which is furthest from the locked frequency.

At 506, the selected VCO is set to begin tuning from a start frequency in the low end of its tuning range. In a particular embodiment, the selected VCO is supplied its corresponding coarse word CW_fmin, setting the tuning frequency to its minimum frequency point. In an alternative embodiment, the VCO is configured to begin tuning from another point in the low end of its frequency range. At 510, the selected VCO is activated and permitted to tune and lock to the requested target frequency.

Figure 5B:
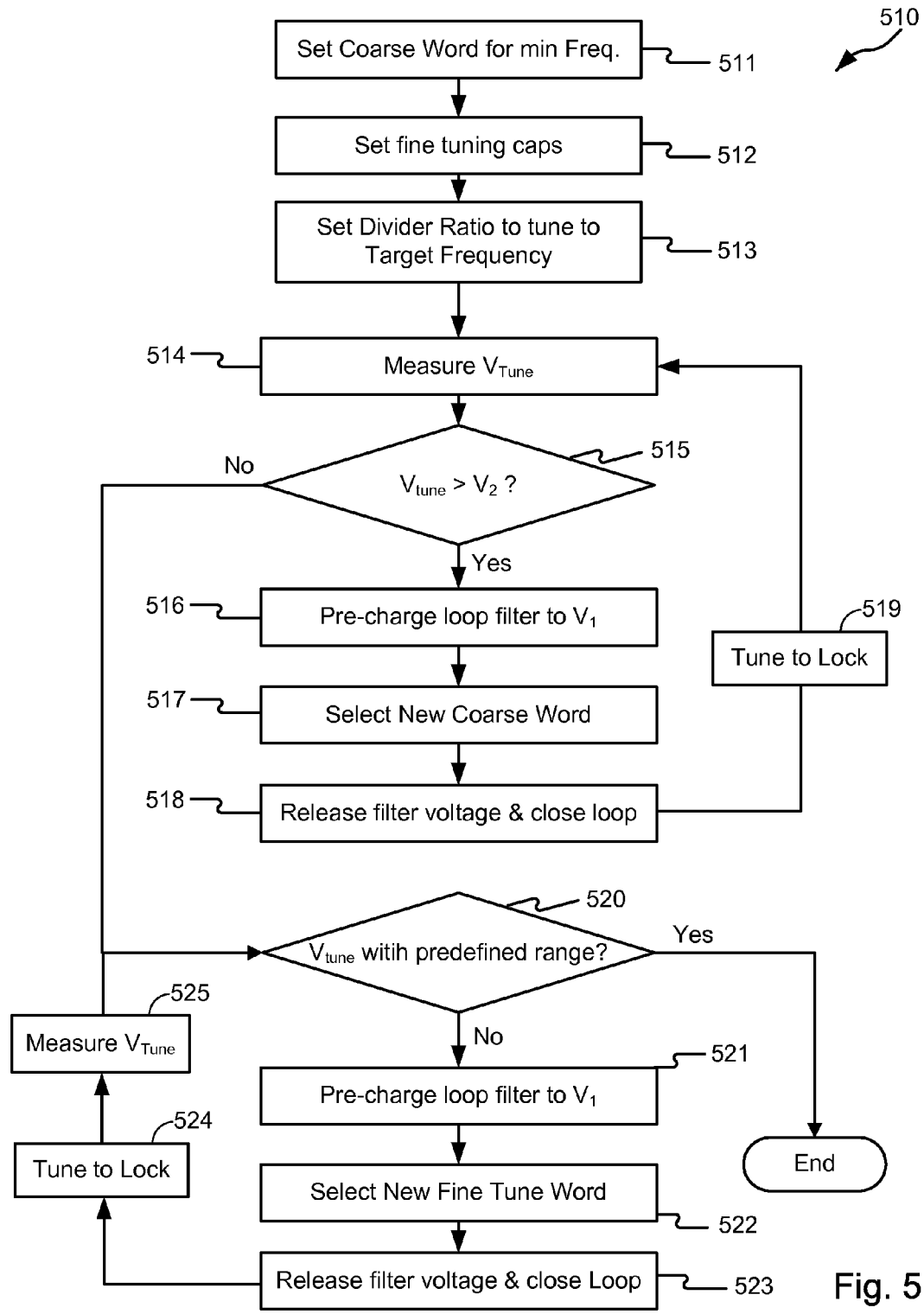
FIG. 5B illustrates an exemplary embodiment of a process in which a selected oscillator is activated and tuned to a target frequency lower than the lowest generated frequency in accordance with the present invention.

FIG. 5B illustrates an exemplary embodiment of a process 510 in which the selected oscillator is activated and tuned to a target frequency lower than the lowest generated frequency in accordance with the present invention. Initially at 511, the selected VCO is set to its lowest operating frequency point by supplying the VCO with the CW_fmin coarse word. At 512, the fine tune setting of the VCO is set to its lowest frequency setting, in a particular embodiment by switching in all of the fine tuning capacitors. At 513, the PLL divider ratio N is set to tune to the target frequency, and at 514 the tuning voltage VTune of the VCO is measured.

At 515, a determination is made as to whether the tuning voltage is measured higher than the VCO's maximum voltage, $V_2$. If it is, the VCO is not in the correct coarse tuning range, as the present coarse tuning range is too low in frequency. In this case, the processes of 516-519 are performed by which the loop filter is precharged at to a predefined voltage (the lowest tuning voltage $V_1$ in a particular embodiment), a coarse word corresponding to the next higher frequency range selected, the loop filter released from the precharge voltage, and the VCO activated with the new coarse word and attempts to tune to lock. An exemplary circuit for pre-charging the loop filter is described below in FIG. 11.

If the tuning voltage $V_{Tune}$ is lower than the VCO's maximum voltage $V_2$, the VCO is within a tunable coarse range, and the process continues at 520-525 in which a fine tuning process is performed. In a particular embodiment illustrated, a first determination is made at 520 as to whether the tuning voltage $V_{Tune}$ is within a predefined range, for example 1.25V to 1.75V, where 1.5V represents the VCO midband frequency point. The predefined range may be any desired range, which, for example represents the most linear range of the oscillator.

If at 520, the tuning voltage $V_{Tune}$ is not within the predefined range, the VCO is out of the correct fine tuning range, and is too low in frequency (as the fine tuning range was set to the lowest tuning range in 512). In this instance, the processes of 521-525 are performed, whereby the loop filter is precharged to a predefined voltage (e.g., the lowest tuning voltage $V_1$), a fine tuning word corresponding to the next higher frequency range selected (which is operable to switch out one or more of the fine tuning capacitors), the loop filter released from the pre-charge voltage, and the VCO activated with the new fine word and attempts to tune to lock. The tuning voltage is again measured to determine if it is within the predefined range, and if not, the processes of 520-525 are repeated. Once the tuning voltage reaches a value within the predefined range, the tuning process concludes.

Computing Intermediate Frequency Points

Figure 5C:
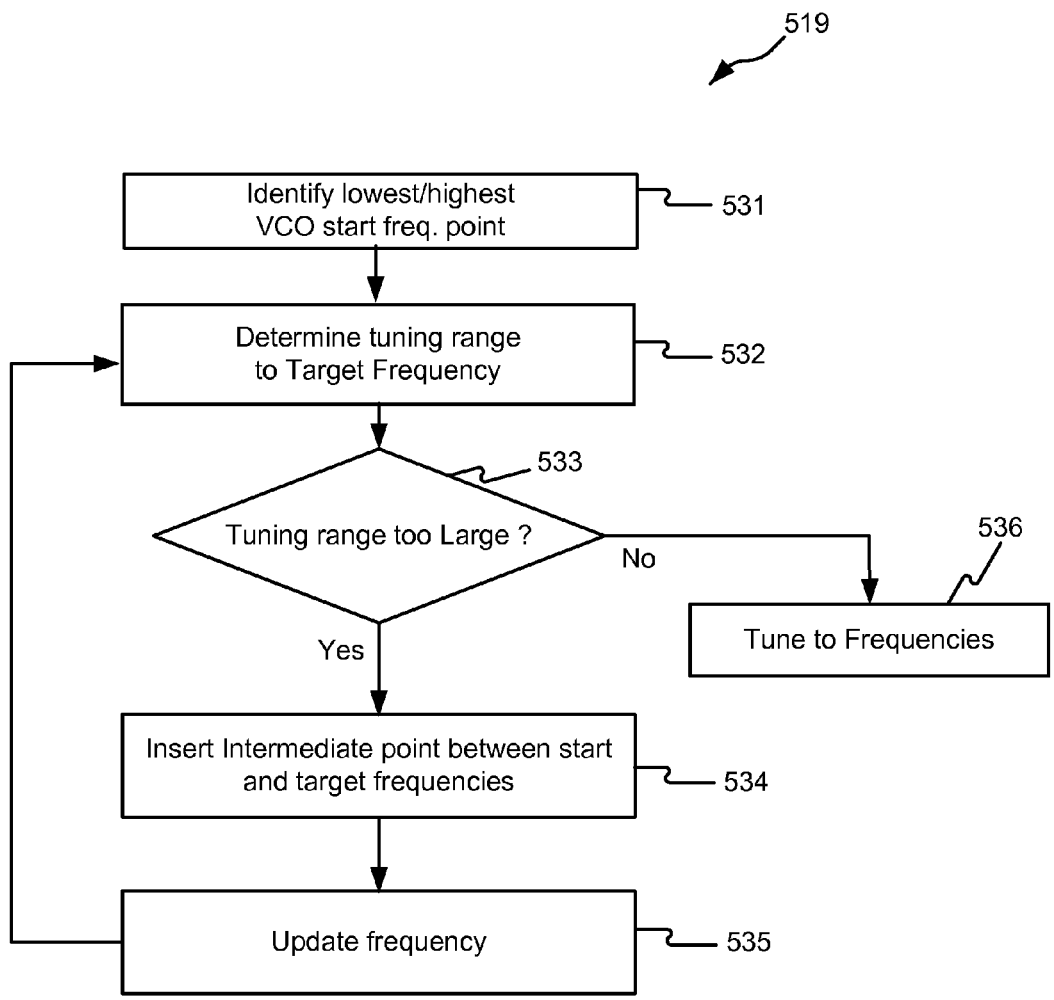
FIG. 5C illustrates an exemplary embodiment of a process illustrated in FIG. 5B in which a selected oscillator tunes to the target frequency in accordance with the present invention.

FIG. 5C illustrates an exemplary embodiment of the process 519 in which the selected oscillator tunes to the desired target frequency in accordance with the present invention. In this embodiment, the start frequency of the VCO is not known in advance, but it is known that the VCO will start tuning from a frequency which is at or above the lowest VCO tuning frequency.

Initially at 531, the lowest VCO (or other oscillator type) frequency is identified. Next at 532, the tuning range between the lowest tuning frequency and the target frequency is determined. In the illustrated embodiment, the lowest VCO frequency is the frequency corresponding to the coarse word CW_fmin, which can be ascertained from the data structure shown in FIG. 3B.

At 533, a determination is whether the tuning range moving from the lowest VCO frequency (or updated start frequency, further explained below) to the target frequency is too large. When the selected VCO tunes over too large of a frequency range, it can create effects which interfere with the operation of an existing frequency.

If at 533, a determination is made that the VCO tuning range to the target frequency would be to wide, the process continues at 534 where an intermediate frequency is defined between the start frequency (either the VCO lowest tuning frequency or a previously defined intermediate frequency point, as described below) and the target frequency. Next at 535, the previous start frequency used in 533 to determine whether the tuning range was too large is updated as being the intermediate frequency, and the process returns to 531, where a further calculation is made to determine whether the tuning range from the new starting frequency (i.e., the computed intermediate frequency point) to the target frequency is too wide. If the tuning range is again too large, the processes of 534 and 535 are repeated to identify a second intermediate tuning point between the first intermediate tuning point and the target frequency. If, at 533, the tuning range is determined to be within acceptable limits, the process continues at 536 where the VCO is controlled to tune to the target frequency via the intermediate points, if any.

Frequency overshoot is one exemplary interference mechanism which can occur when the oscillator tunes over a long frequency range to a target frequency located relatively close to an existing frequency. In such an instance, it can be more advantageous to tune to intermediate frequency points between the start frequency and the final target frequency in order to reduce the amount of frequency overshoot. In such an instance, the total tuning range is reduced to two smaller ranges, a first extending between the lowest VCO frequency and the intermediate tuning point, and a second extending between the intermediate tuning point and the target frequency. Further iteratively, the frequency range between the intermediate tuning point and the target frequency, or the lowest VCO frequency and the intermediate point may prove to be also too large, in which case a further intermediate point may be defined therebetween.

In one embodiment, the determination process in 532 is based upon a computation of an intermediate tuning point $F_{Int}$ and whether that intermediate tuning point $F_{Int}$ satisfies a predefined condition. In a specific embodiment, the intermediate tuning point FInt is calculated as follows:

$$F_{Int} = F_{Target} - \frac{1}{\text{Overshoot}}(F_{avoid} - F_{Target} - Mar) \qquad \text{eq. (1)}$$

where $F_{Int}$ is the intermediate frequency (Hz) which is to be determined;

$F_{avoid}$ is the existing or second frequency (Hz);

$F_{Target}$ is the Target VCO frequency (Hz) in the first iteration, and the previously computed intermediate tuning point $F_{Int}$ in subsequent iterations;

Mar is a predefined margin (Hz); and

Overshoot is a predefined frequency overshoot quantity (dimensionless).

In the illustrated embodiment of FIGS. 5A and 5B, the second frequency parameter $F_{avoid}$ is the lowest locked frequency which is to be avoided, the parameter $F_{Target}$ is the desired target frequency, the parameter Overshoot is a percentage of the last frequency step size to the target frequency, and Mar is a predefined margin optionally allocated as a safety margin used to account for process variation, environmental factors and the like, an exemplary embodiment of which is 0.2%-5% of the VCO tuning range.

Once the intermediate point $F_{Int}$ is computed, a determination is made as to whether the intermediate point is higher in frequency than the VCO's lowest starting frequency:

$$F_{Int} \overset{?}{>} F_{VCO\_Low} \qquad \text{eq. (2)}$$

wherein $F_{VCO\_Low}$ is the lowest VCO start frequency. If the condition is satisfied (i.e., the computed intermediate point is higher than the lowest VCO starting frequency), VCO tuning to the intermediate point is deemed necessary.

As an example, given the following conditions: Overshoot is 50%, the selected VCO tunes from a lowest frequency of 1 GHz to a target frequency of 1.3 GHz, an existing frequency $F_{avoid}$ resides at 1.6 GHz, and a guard margin of 0.03 GHz is used, eq. (1) yields the first intermediate point as being:

$$F_{Int,1st} = 1.3 - \frac{1}{0.5}(1.6 - 1.3 - 0.03) = 0.76 \text{ GHz.} \qquad \text{eq. (3)}$$

In this case, the first intermediate point $F_{Int,1st}$ (0.76 GHz) $<F_{VCO\_Low}$ (1.0 GHz), and therefore tuning to this point is not needed (and is not possible, since the lowest VCO starting frequency is 1.0 GHz). In this case, tuning the VCO over the widest possible tuning range to the target frequency from 1.0 GHz to 1.3 GHz will not result in disturbing the existing frequency located at $F_{avoid}$.

Alternatively, if the existing frequency $F_{avoid}$ is closer to the target frequency $F_{Target}$, e.g., 1.35 GHz, the first intermediate point would be computed as:

$$F_{Int,1st} = 1.3 - \frac{1}{0.5}(1.35 - 1.3 - 0.03) = 1.26 \text{ GHz} \quad \text{eq. (4)}$$

In this case, the condition $F_{Int,1st}$ (1.26 GHz)>$F_{VCO\_Low}$ (10 GHz) is true, and therefore the tuning range is needed to be too large at 532.

In such an instance, the process continues at 534 where the first intermediate point as computed in eq. (4) is defined as a tuning point which the VCO will tune to prior to tuning to the target frequency at 1.3 GHz.

At 535, the intermediate tuning point computed in eq (4) becomes the target frequency $F_{Target}$, and a second computation is made at 533 using eq. (1) to determine if a second intermediate point lies above the lowest VCO frequency:

$$F_{Int,2nd} = 1.26 - \frac{1}{0.5}(1.35 - 1.26 - 0.03) = 1.14 \text{ GHz} \quad \text{eq. (5)}$$

In this instance, the aforementioned condition also holds, as $F_{Int,2nd}$ (1.14 GHz)>$F_{VCO\_Low}$ (10 GHz), so tuning to the second intermediate point is needed, and a third iteration is performed, whereby the target frequency $F_{Target}$ becomes the second intermediate point 1.14 GHz:

$$F_{Int,3rd} = 1.14 - \frac{1}{0.5}(1.35 - 1.14 - 0.03) = 0.78 \text{ GHz} \quad \text{eq. (6)}$$

In this instance, the aforementioned condition does not hold, since $F_{Int,3rd}$ (0.78 GHz)<$F_{VCO\_Low}$ (1.0 GHz), so tuning to the third intermediate point is not needed.

Once the intermediate tuning points are determined in this second example, the VCO is controlled to tune (or programmed to later tune) from its VCO start point (wherever between 1.0 GHz and 1.14 GHz that may be) to 1.14 GHz, then from 1.14 GHz to 1.26 GHz, and finally from 1.26 GHz to the final target frequency of 1.30 GHz (process 535). In this way, the frequency offset is reduced to ensure that it does not substantially impact the operation of the existing frequency at 1.35 GHz.

In a further alternative embodiment, the determination process in 533 as to whether the VCO tuning range is too wide is computed as:

$$|F_{Int} - F_{Target}| * \text{Overshoot} \stackrel{?}{>} |F_{avoid} - F_{Target} - \text{Mar}| \quad \text{eq. (7)}$$

The left side of the inequality represents the bandwidth between the target frequency and the computed intermediate frequency point, and the right side of the equation represents the bandwidth between the target frequency and the existing (avoid) frequency, offset by a predefined margin. Generally, if the left hand side is larger than the right, no intermediate point is deemed necessary. Alternatively, when the left and right hand sides become approximately of the same magnitude or when the right hand side becomes larger than the left hand side, tuning to one or more of the computed intermediate frequency points is deemed necessary.

The same process may be used to compute intermediate frequency points for process 619, except that eqs. (1) and (2) are expressed as:

$$F_{Int} = F_{Target} + \frac{1}{\text{Overshoot}}(F_{Target} - F_{avoid} - \text{Mar}) \quad \text{eq. (8)}$$

$$F_{Int} \stackrel{?}{<} F_{VCO\_High} \quad \text{eq. (9)}$$

$F_{VCO\_High}$ representing the VCO's highest start frequency. When the intermediate frequency point $F_{Int}$ is located below the $F_{VCO\_High}$, VCO tuning to the computed intermediate frequency point is deemed necessary.

In a particular embodiment, the overshoot parameter ranges from 5 to 80 percent, and in a specific embodiment is 20 percent. The present invention provides a loop filter architecture which reduces frequency overshoot during the tuning process, and an exemplary embodiment of this structure is presented in detail below.

While the frequency overshoot effect is modeled in terms of a percentage of the tuning range covered, other models may be used as well in the present invention. Furthermore, as an alternative to the tuning processes described in 520-525 in which capacitors are systematically disconnected to obtain a tuning voltage within a predefined range, VCO fine tuning may involve the processes of 531-536.

Target Frequency Located Above Highest Locked Frequency

Figure 6A:
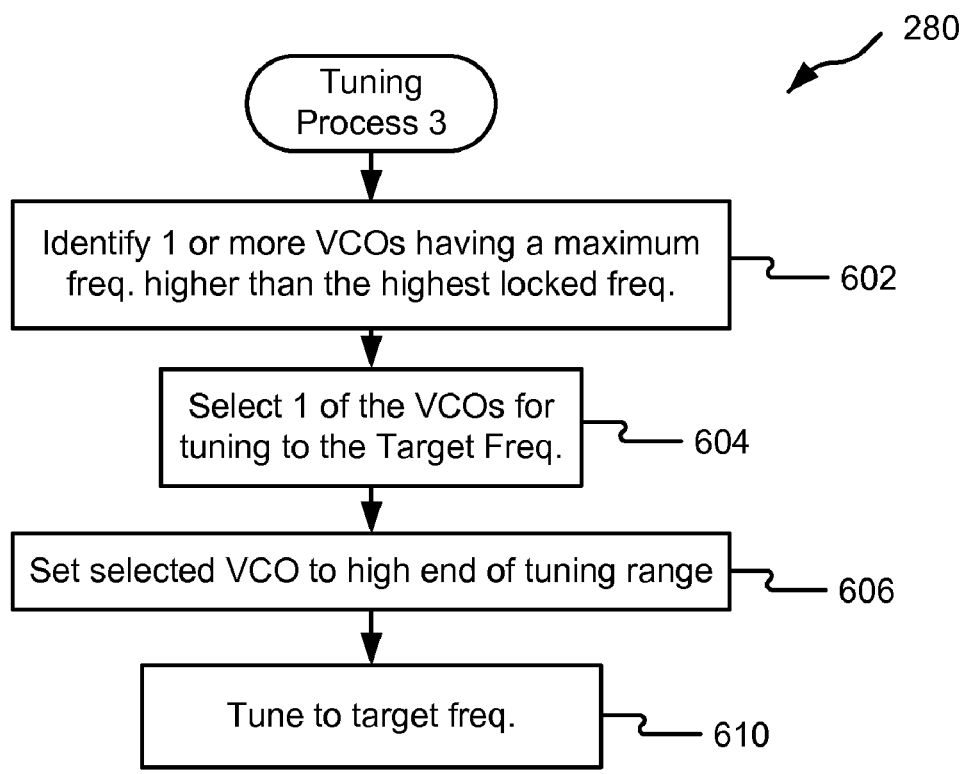
FIG. 6A illustrates an exemplary embodiment of a tuning process in which the requested target frequency is higher than the highest generated frequency in accordance with the present invention.

FIG. 6A illustrates an exemplary embodiment of a tuning process 280 in which the requested target frequency is higher than the highest generated frequency in accordance with the present invention. In a particular embodiment, the process is largely analogous to that described and shown in FIG. 5A, a difference being that the target frequency is approached from the high side of the highest generated frequency without crossing the highest generated frequency.

The process begins at 602 whereby one or more oscillators (e.g., a VCO) having a maximum frequency higher than the highest generated frequency are identified. At 604, one of the identified VCOs is selected for tuning to the target frequency. The selection process may involve various factors, including which of the selected VCOs, when tuned to the target frequency, will be closest to, or within the linear-most tuning range, and which selected VCO can be activated at a frequency which is furthest from the locked frequency.

At 606, the selected VCO is set to begin tuning from a start frequency in the high end of its tuning range. In a particular embodiment, the selected VCO is supplied its corresponding coarse word CW_fmax, setting the tuning frequency to its maximum frequency point. In an alternative embodiment, the VCO is configured to begin tuning from another point in the high end of its frequency range. At 610, the selected VCO is activated and permitted to tune and lock to the requested target frequency.

Figure 6B:
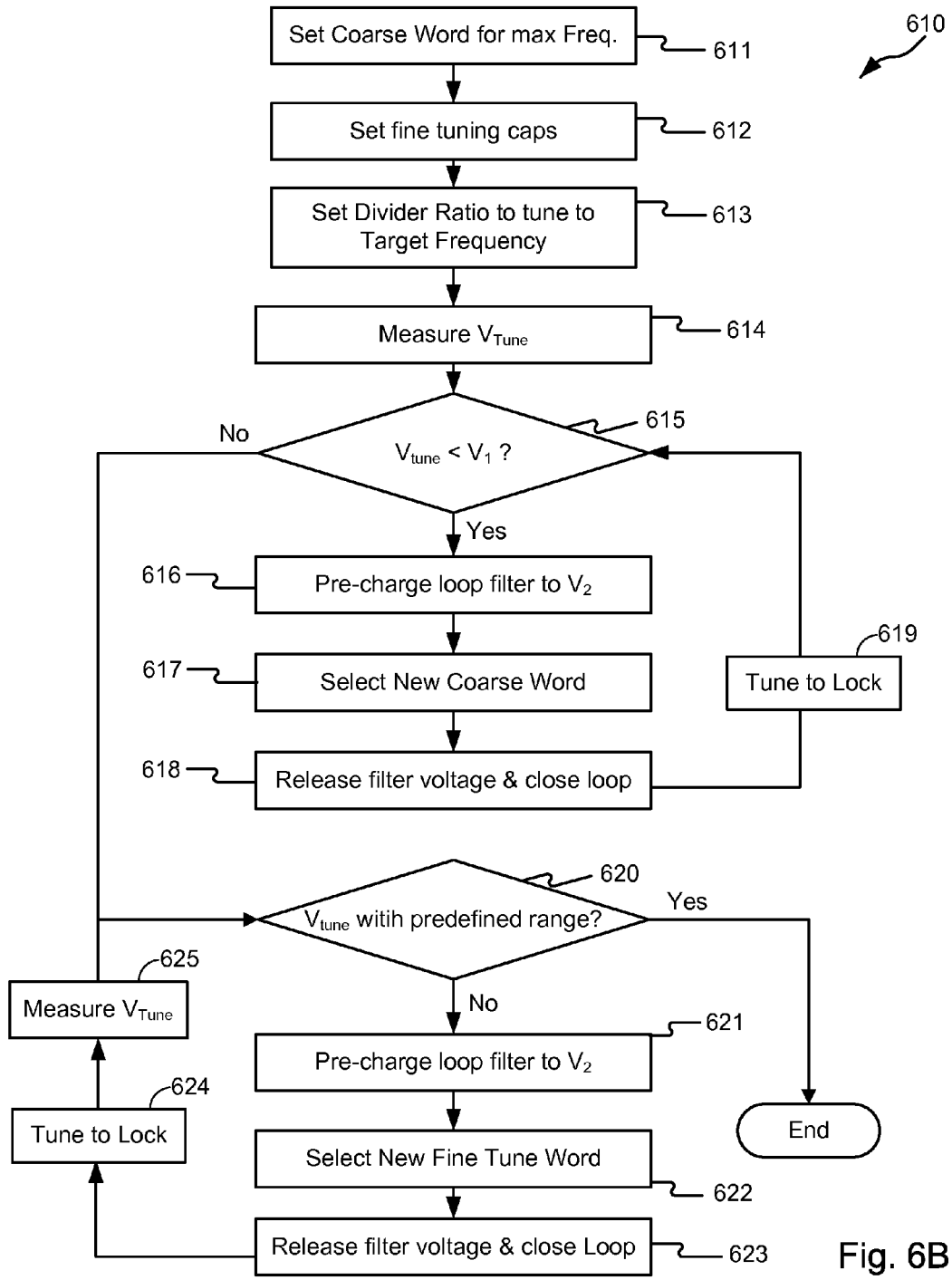
FIG. 6B illustrates an exemplary embodiment of a process in which a selected oscillator is activated and tuned to a target frequency higher than the highest generated frequency in accordance with the present invention.

FIG. 6B illustrates an exemplary embodiment of a process 610 in which the selected oscillator is activated and tuned to a target frequency higher than the highest generated frequency in accordance with the present invention. The process is largely analogous to that described and shown in FIG. 5B, a difference being that tuning is performed from the high side of the highest generated/locked frequency.

Initially at 611, the selected VCO is set to its highest operating frequency point by supplying the VCO with the CW_fmax coarse word. At 612, the fine tune setting of the VCO is set to its highest frequency setting, in a particular embodiment by disconnecting all of the fine tuning capacitors. At 613, the PLL divider ratio N is set to tune to the target frequency, and at 614 the tuning voltage $V_{Tune}$ of the VCO is measured.

At 615, a determination is made as to whether the tuning voltage is measured lower than the VCO's minimum voltage, $V_1$. If it is, the VCO is not in the correct coarse tuning range, as the present coarse tuning range is too high in frequency. In this case, the processes of 616-619 are performed by which the loop filter is pre-charged at to a predefined voltage (the highest tuning voltage $V_2$ in a particular embodiment), a coarse word corresponding to the next lower frequency range selected, the loop filter released from the pre-charge voltage, and the VCO activated with the new coarse word and attempts to tune to lock. An exemplary circuit for pre-charging the loop filter is described below in FIG. 11.

If the tuning voltage $V_{Tune}$ is higher than the VCO's minimum voltage $V_1$, the VCO is within a tunable coarse range, and the process continues at 620-625 in which a fine tuning process is performed. In a particular embodiment illustrated, a first determination is made at 620 as to whether the tuning voltage $V_{Tune}$ is within a predefined range, for example 1.25V to 1.75V, where 1.5V represents the VCO midband frequency point. The predefined range may be any desired range, which, for example represents the most linear range of the oscillator.

If at 620, the tuning voltage $V_{Tune}$ is not within the predefined range, the VCO is out of the correct fine tuning range, and is too high in frequency (as the fine tuning range was set to the highest tuning range in 612). In this instance, the processes of 621-625 are performed, whereby the loop filter is pre-charged to a predefined voltage (e.g., the highest tuning voltage, $V_2$), a fine tuning word corresponding to the next lower frequency range selected (which is operable to connect one or more of the fine tuning capacitors), the loop filter released from the pre-charge voltage, and the VCO activated with the new fine word and attempts to tune to lock. The tuning voltage is again measured to determine if it is within the predefined range, and if not, the processes of 620-625 are repeated. Once the tuning voltage reaches a value within the predefined range, the tuning process concludes.

The tuning process 619 of identifying and tuning to intermediate points is largely analogous to that described and shown in FIG. 5C. In one embodiment of the present invention, the determination as to whether a tuning range is too large is performed using the processes 531-536, and eqs. (8) and (9) outlined therefor.

For example, given the following condition: Overshoot is 50%, the VCO has a maximum start frequency $F_{VCO\_High}$ of 1.60 GHz, the target frequency $F_{Target}$ is 1.3 GHz, an existing frequency $F_{avoid}$ resides at 1.25 GHz, and a guard margin Mar of 0.03 GHz, eq. (6) yields a first intermediate tuning point $F_{Int}$ at:

$$F_{Int,1st} = 1.3 + \frac{1}{0.5}(1.3 - 1.25 - 0.03) = 1.34 \text{ GHz} \qquad \text{eq. (10)}$$

As the condition $F_{Int}$ (1.34 GHz)<$F_{VCO\_High}$ (1.6 GHz) of eq. (14) is met, the tuning range is deemed to large, and tuning to the intermediate point is needed prior to tuning to the target frequency.

A second intermediate tuning point is computed in which $F_{Target}$ (previously 1.3 GHz) becomes the previously-computer intermediate tuning point, 1.34 GHz:

$$F_{Int,2nd} = 1.34 + \frac{1}{0.5}(1.34 - 1.25 - 0.03) = 1.46 \text{ GHz} \qquad \text{eq. (11)}$$

The iteration provides an intermediate tuning point at 1.46 GHz, which below the highest tuning frequency of the VCO (1.6 GHz). Accordingly the condition in eq. (14) is met, and tuning to the second intermediate point is necessary. In the same manner, a third intermediate tuning point is further calculated:

$$F_{Int,3rd} = 1.46 + \frac{1}{0.5}(1.46 - 1.25 - 0.03) = 1.82 \text{ GHz} \qquad \text{eq. (12)}$$

In this case, the third intermediate point is located above the target frequency of 1.6 GHz, and accordingly tuning to it is not needed.

As above, the overshoot parameter may comprise a range of values, an exemplary embodiment being from 5 to 80 percent, and in a specific embodiment 20 percent. Further, other linear or non-linear computations may be used to model frequency overshoot, as well as other effects. In addition, the fine tuning processes described in 620-625 in which capacitors are systematically connected to obtain a tuning voltage within a predefined range, may alternatively involve the tuning processes of 531-535.

Target Frequency Located Between Existing Locked Frequencies

Figure 7:
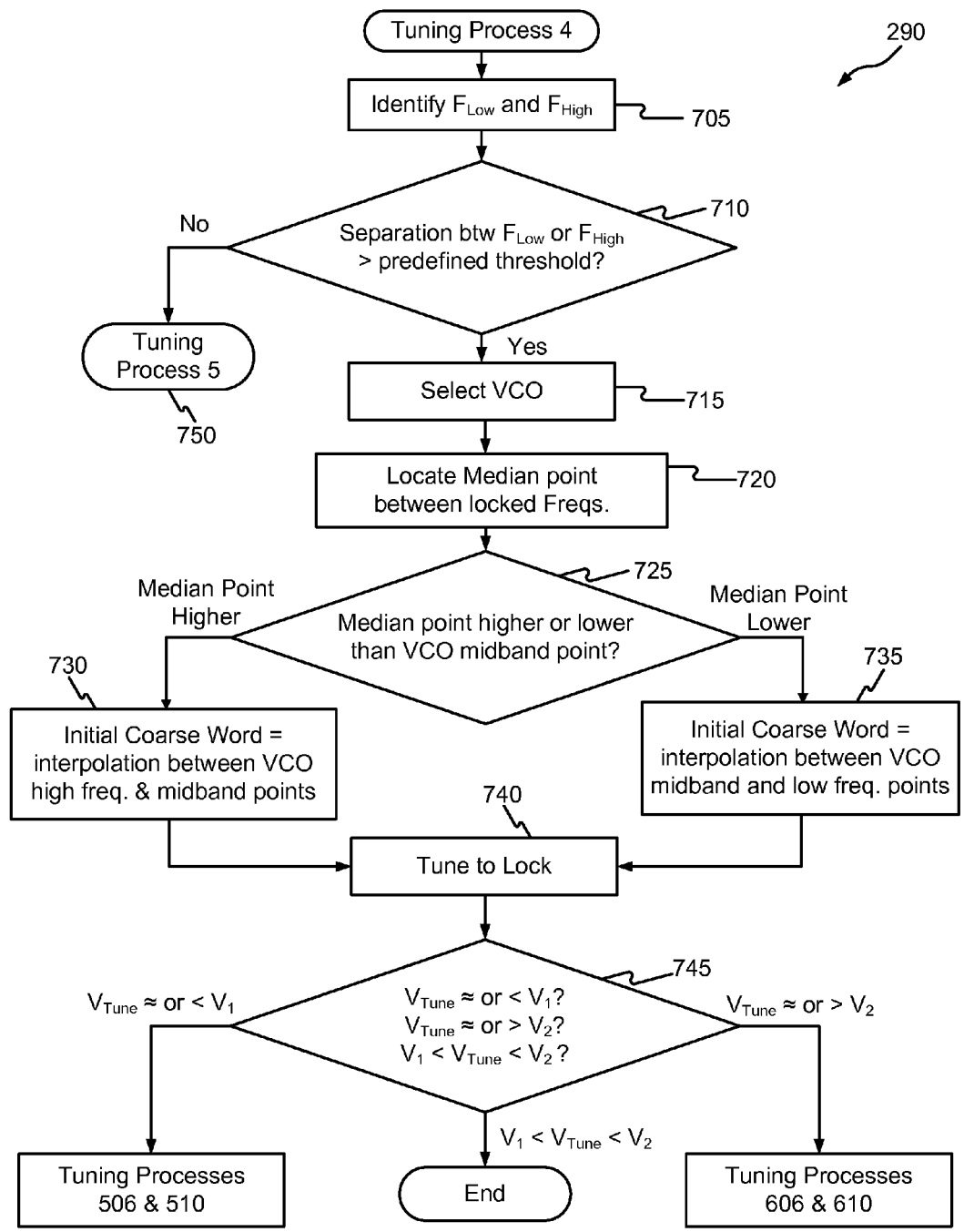
FIG. 7 illustrates an exemplary embodiment of a tuning process in which the requested target frequency is located between two existing frequencies in accordance with the present invention.

FIG. 7 illustrates an exemplary embodiment of a tuning process 290 in which the requested target frequency is located between two existing frequencies $F_{High}$ and $F_{Low}$ in accordance with the present invention. The process begins at 705, whereby the frequencies $F_{High}$ and $F_{Low}$ located higher and lower than the requested target frequency are identified. In a particular embodiment, this process is performed by accessing the already_generated data structure 370 illustrated in FIG. 3C.

At 710, a determination is made as to whether the separation between $F_{High}$ and $F_{Low}$ is greater than a predefined threshold. In a particular embodiment, the predefined threshold represents the tuning range, plus a predefined margin over which the selected VCO can tune whereby the accompanying frequency overshoot effect would not affect the existing $F_{High}$ and $F_{Low}$ frequencies. In a particular embodiment, the predefined margin includes interpolation error (or a factor thereof) that is introduced in the tuning process when the VCO attempts to tune to the target frequency using coarse and/or fine tuning words, as that tuning process is further defined below.

If at 710, a determination is made that the separation between $F_{High}$ and $F_{Low}$ is greater than the predefined threshold, an oscillator is selected at 715. The selection process may involve various factors, including which of the selected VCOs, when tuned to the target frequency, will be closest to, or within the linear-most tuning range. If the high and low frequencies $F_{High}$ and $F_{Low}$ are spaced apart less than the predefined threshold, the process continues at 750, which is further illustrated in FIG. 8A.

At 720, the median point between $F_{High}$ and $F_{Low}$ is determined at 720. In a particular embodiment, this process is performed using the already_generated data structure 370 shown in FIG. 3C. At 725, a determination is made as to whether the median frequency point is above or below the midband frequency point of the selected VCO. If the median frequency point is located higher, a start frequency for the selected VCO is computed as an interpolated value between the high and midband frequencies (730). Alternatively, if the median frequency is located lower than the midband frequency of the selected VCO, the start frequency for the selected VCO is set as an interpolated value between the midband and low frequency points (735). In this manner, the start frequency is located closer to the median frequency point, and thus initial activation of the VCO is less likely to disturb either of the existing high or low frequencies $F_{High}$ and $F_{Low}$.

The start frequency is computed as described above, and the corresponding coarse word supplied to the selected VCO. The divider ratio is set to tune to the target frequency, and one half of the fine tuning capacitors is switched in. The selected VCO is then activated and begins tuning from the start frequency toward the target frequency (740). The VCO is permitted sufficient time to achieve lock, and subsequently the tuning voltage $V_{Tune}$ is measured, and a determination is made at 745 as to whether $V_{Tune}$ is: (i) at or near the VCO's lowest tuning voltage $V_1$, (ii) at or near to the VCO's highest tuning voltage $V_2$, or (iii) generally in the center of voltage range between $V_1$ and $V_2$. If $V_{Tune}$ is measured as being at or near to the lowest tuning voltage $V_1$, the VCO may be operating in too high of a frequency range. In such an instance, the coarse and fine tuning processes of 506 and 510 illustrated in FIGS. 5A and 5B are executed to search for a better VCO tuning range. If $V_{Tune}$ is measured as being at or near to the highest tuning voltage $V_2$, the VCO may be in too low of a frequency range. In such an instance, the coarse and fine tuning processes of 606 and 610 illustrated in FIGS. 6A and 6B are executed to search for a better VCO tuning range. The tuning processes of both 260 and 280 may include the operations of computing and tuning to intermediate frequency points in the direction toward the target frequency. Alternatively, if the VCO achieves lock to the target frequency, and $V_{Tune}$ is measured between the $V_1$ and $V_2$, VCO operation is determined to be within acceptable limits and the tuning process concludes. While $V_1$ and $V_2$ are described above in terms of the VCO's minimum and maximum tuning voltages, e.g., 0.5V-3.5V, they may equally correspond to a more narrow voltage range which more tightly defines the VCO's optimal region of operation, e.g., 1.25V-1.75V. In the latter embodiment, a tuning voltage less than 1.25V would result in a tuning operation as defined by 260 in FIG. 5A, and similarly for a tuning voltage greater than 1.75V resulting in the tuning operation defined by 280 in FIG. 6A.

Target Frequency Located Between Closely Spaced Frequencies

Figure 8A:
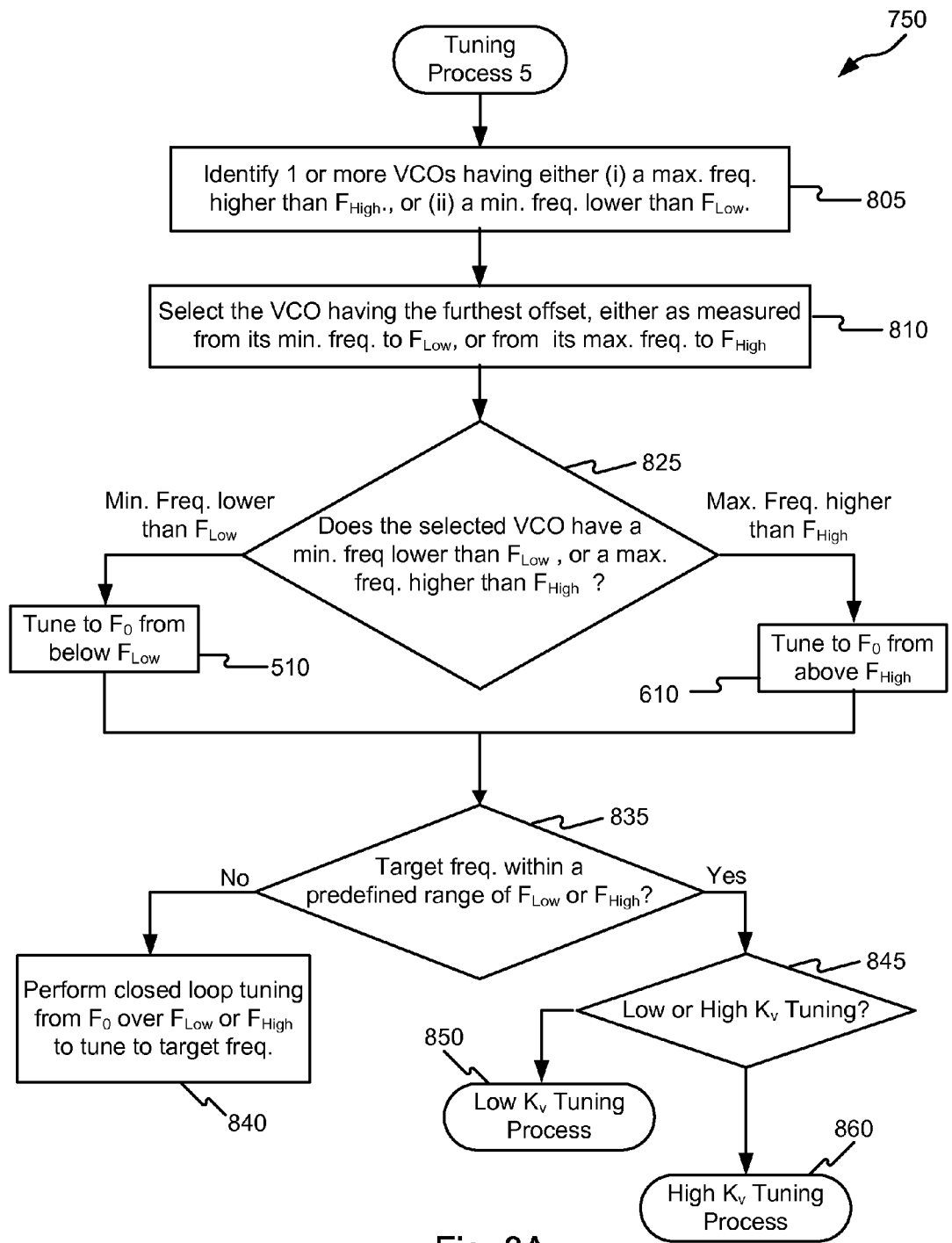
FIG. 8A illustrates an exemplary embodiment of a tuning process in which the requested target frequency is located between two closely spaced existing frequencies in accordance with the present invention.

FIG. 8A illustrates an exemplary embodiment of a tuning selection process 750 in which the requested target frequency is located between two closely spaced existing frequencies $F_{High}$ and $F_{Low}$ in accordance with the present invention. The term "closely spaced" refers to the separation between the existing frequencies as being insufficient to permit a oscillator, such as a VCO, from tuning over a large portion of its tuning range between the two frequencies $F_{High}$ and $F_{Low}$ without disturbing one or both the frequencies. In such an instance, effects created by the VCO's tuning operations (e.g., frequency overshoot) are likely to impact the operation of one or both of the existing frequencies due to their proximity in frequency to the oscillator. As noted in the exemplary embodiment above, the spacing may be on the order of 175 MHz, although the frequency spacing may be narrower or wider than this in other embodiments, for example, frequency spacings less than or equal to 10 MHz, 20 MHz, 50 MHz, 75 MHz, 100 MHz, 150 MHz, 200 MHz, 250 MHz, 500 MHz or wider frequency spacings.

The exemplary process begins at 805, where one or more VCOs having either (i) a maximum frequency higher than $F_{High}$, or (ii) a minimum frequency lower than $F_{Low}$ are identified. This process may be performed by accessing the vco_freq data structure 360 shown in FIG. 3B. Subsequently at 810, one of the identified VCOs is selected, the selected VCO preferably having the furthest offset, either as measured from its minimum frequency to $F_{Low}$, or from its maximum frequency to $F_{High}$. In this manner, the VCO having the largest frequency offset from either $F_{High}$ or $F_{Low}$ is selected.

The process continues at 825, whereby a determination is made as to whether a VCO having a frequency lower than $F_{Low}$ is selected, or whether a VCO having a frequency higher than $F_{High}$ is selected. As noted above, the VCO which provides the greatest offset from its respective neighboring frequency $F_{Low}$ or $F_{High}$ is the VCO preferably chosen. If a VCO neighboring $F_{Low}$ is selected, the tuning procedure of 510 illustrated in FIG. 5B is performed to tune to an approach frequency $F_0$ which is proximate to, but does not cross the existing frequency $F_{Low}$. The computation and intermediate tuning process 519 illustrated in FIG. 5C may be employed in the coarse or fine tuning procedures included therein.

The approach frequency $F_0$ is located a predefined distance away (below) from the existing frequency $F_{Low}$, the predefined distance operable to place the approach frequency close to the existing frequency so as to provide a relative small frequency jump from this point to a close approximation of the target frequency located between existing frequencies $F_{Low}$ and $F_{High}$. However, the approach frequency $F_0$ is preferably not located too close to the existing frequency $F_{Low}$, as a large number of intermediate frequencies would be needed to tune to this point from the VCO start frequency. Accordingly, a balancing of the two requirements will determine the most appropriate offset for the approach frequency $F_0$, and in an exemplary embodiment, an offset of between 1-10 percent of the VCO tuning range is used. In the illustrated embodiment in which the VCO tuning range is approximately 200 MHz, the approach frequency $F_0$ is defined at 2.5 MHZ below the existing frequency $F_{Low}$.

In a particular embodiment of this process when the selected VCO has a minimum frequency lower than $F_{Low}$, tuning at the approach frequency $F_0$ is locked using a tuning voltage near the low end of the $V_{Tune}$ range, e.g., 0.5 V. This establishes a condition, such that when the VCO tunes higher to the target frequency, the VCO will be in/near its linear most region (e.g., 1.5 V).

Alternatively, if a VCO neighboring $F_{High}$ is selected, the tuning procedure of 610 illustrated in FIG. 6B is performed to tune to an approach frequency $F_0$ which is proximate to, but does not cross the existing frequency FHigh. In a particular embodiment of this process, tuning at the approach frequency $F_0$ is locked using a tuning voltage near the high end of the $V_{Tune}$ range, e.g., 2.5 V. This establishes a condition such that when the VCO tunes lower to the target frequency, the VCO will be in/near its linear most region (e.g., 1.5 V). The intermediate tuning process 619 illustrated in FIG. 5C may be employed in the coarse or fine tuning procedures included therein.

Next at 835, a determination is made as to whether the requested target frequency, located between the existing frequencies, $F_{Low}$ and $F_{High}$, is within a predefined range of the approach frequency $F_0$. The predefined range within which the approach and target frequencies lie is based upon several factors, including the linear bandwidth of the VCO tuning range. In one embodiment, the predefined range is generally between 1-10% of the VCO tuning range, and in a particular exemplary embodiment is 10 MHz for a VCO having a tuning range of approximately 200 MHz.

If the requested target frequency is within the predefined range of the approach frequency $F_0$, process 840 is performed, whereby, the VCO is closed loop locked from the approach frequency $F_0$, across the existing frequency (either $F_{Low}$ or $F_{High}$) to the target frequency. In a closed loop VCO tuning operation, the VCO is programmed with appropriate coarse and fine tuning words for tuning to a frequency according to the PLL dynamics.

As noted above, the tuning process may involve tuning to the approach frequency $F_0$ at a $V_{Tune}$ voltage which is on the low or high end of the $V_{Tune}$ range, thus resulting in the VCO being tuned nearer or within its linear most $V_{Tune}$ range once tuned to the target frequency.

Once the VCO has been tuned to what is believed the target frequency, its tuning voltage is measured. If the tuning voltage is not within an acceptable range (e.g., 1.25 V<$V_{Tune}$<1.75 V) when tuned to the target frequency, then the VCO is programmed with a new coarse and/or fine tune word, and activated to perform another closed loop tuning operation. The process repeats until the aforementioned conditions are met. In an alternative embodiment, the fine tuning process is performed in an open loop operation in which the VCO is permitted to freely tune between a starting and locked frequency if the frequency excursion in such an operation is not expected to be too great that resulting frequency overshoot would affect one or more neighboring frequencies.

If, at 835, the target frequency is located further than the predefined range from the approach frequency $F_0$, the process continues at 845 where a determination is made as to whether a low or a high $K_V$ tuning procedure is to be made (processes 850 or 860). As known in the art, the parameter $K_V$ refers to VCO gain or tuning sensitivity, and describes the frequency shift per volt applied. VCOs employing high $K_V$ exhibit wider tuning ranges and greater linearity per Hz over their ranges, low $K_V$ VCOs exhibit lower sensitivity to $V_{Tune}$ noise. Accordingly, PLL systems of either type may be used, depending the application and design requirements, and the present invention further presents a VCO tuning regime for each. While high and low $K_V$ values are relative, generally high $K_V$ refers to an oscillator sensitivity on the order of 25-70 MHz/V and above, while low $K_V$ VCOs are generally in the range of 10-30 MHz/V.

Figure 8B:
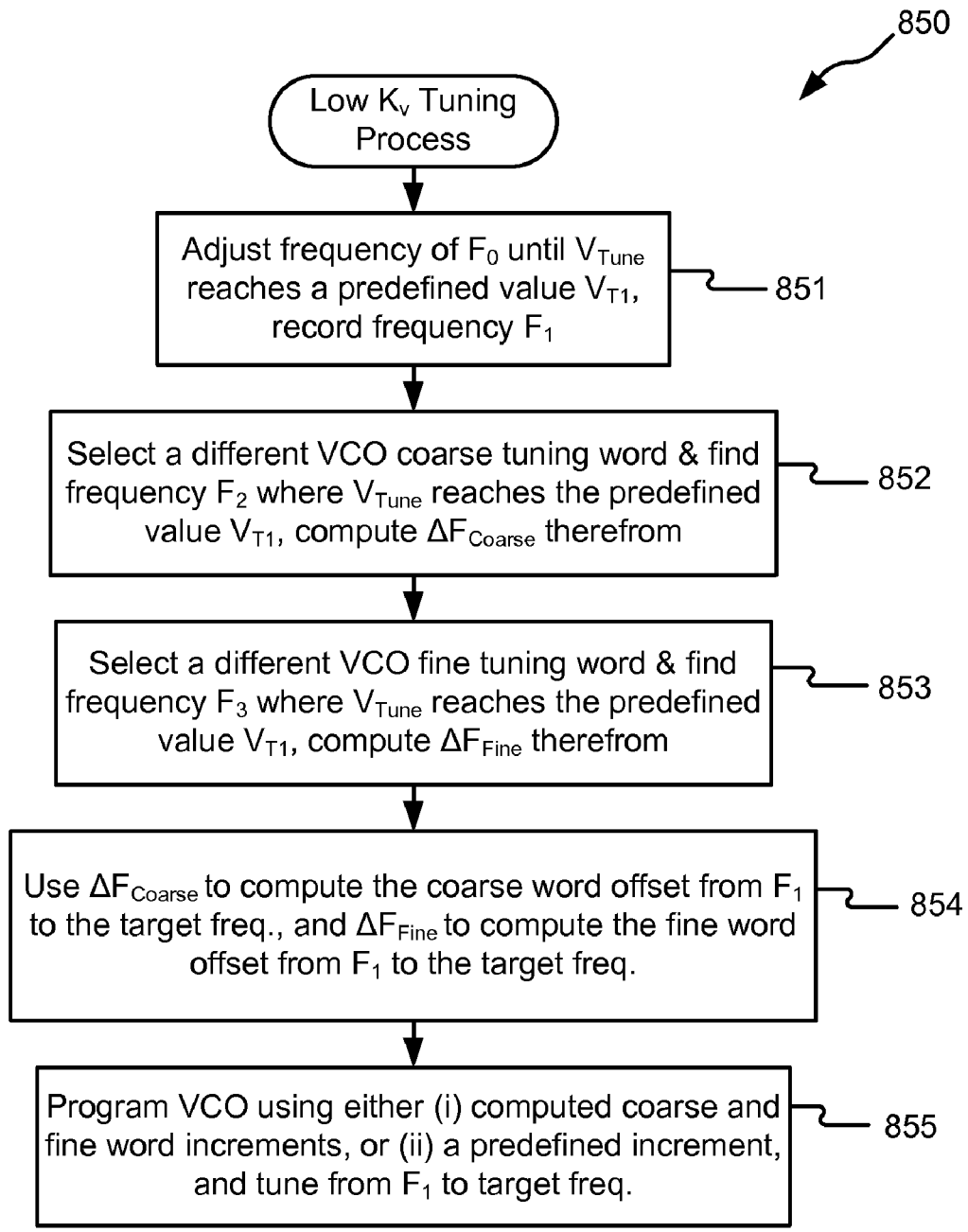
FIG. 8B illustrates an exemplary embodiment of process for tuning a low $K_v$ voltage controlled oscillator to the requested target frequency residing between two closely spaced existing frequencies in accordance with the present invention.

FIG. 8B illustrates an exemplary embodiment of process 850 for tuning a low $K_V$ VCO to the requested target frequency residing between two closely spaced existing frequencies $F_{Low}$ or $F_{High}$ in accordance with the present invention. Initially at 851, the frequency of the VCO, which has been tuned at the approach frequency $F_0$ in process 825 or 830 previously in FIG. 8B, is varied until the tuning voltage $V_{Tune}$ reaches a predefined value $V_{T1}$, the VCO being tune to frequency $F_1$ at this point. The coarse and fine tuning words used to tune to $F_1$ (CW1 and FW1) are then recorded.

In a particular embodiment, the value $V_{T1}$ is a tuning voltage which is at/near the center of the VCO's linear most tuning range. In the illustrated embodiment described herein, this voltage is 1.5V, although those skilled in the art will appreciate than another voltage may be used as well. The tuning voltage is varied so as to move to F1 without crossing the proximate existing frequency (either $F_{Low}$ or $F_{High}$). If it is determined that adjusting the VCO's tuning voltage towards $V_{T1}$ results in moving the VCO tuned frequency closer to the existing proximate frequency than $F_0$, a new coarse and/or fine tuning word is selected and used to tune the VCO further away from the approach frequency $F_0$ until the voltage $V_{T1}$ is measured at a frequency $F_1$ which is no closer to the existing proximate frequency than the approach frequency $F_0$.

At 852, a second VCO coarse tuning word (CW2) is supplied to the VCO which tunes the VCO frequency even further away from the proximate existing frequency, and a frequency is found where the tuning voltage is substantially $V_{T1}$. The differences in tuning frequencies $F_1$ and $F_2$ and corresponding coarse words CW1 and CW2 are used to generate a quantity $\Delta F_{coarse}$ which describes the frequency shift per coarse word at the voltage VT1. For example, following the exemplary embodiment in which the approach frequency $F_0$ is proximate to and below the lowest existing frequency $F_{Low}$, a frequency $F_1$ is tuned at substantially 1.5V further below $F_0$ in accordance with process 851. Subsequently, a new coarse word, e.g., CW2=CW1-2 (two coarse words lower than the first coarse word, CW1), is used to tune the VCO to a frequency $F_2$, and a ratio $\Delta F_{coarse}$ is derived from (F1-F2)/(CW1-CW2) which describes the frequency shift per coarse tuning word. As readily apparent, a different coarse word offset may be used in alternative embodiments as well.

A similar operation is performed at 853 to obtain a ratio $\Delta F_{fine}$ to describe the VCO's frequency shift per fine tuning word. In an exemplary embodiment of this process, the VCO is fine tuned from $F_2$ to a new frequency, $F_3$, where the tuning voltage reaches substantially $V_{T1}$, and the corresponding fine tuning word FW3 is recorded. A ratio $\Delta F_{fine}$ is derived from (F2-F3)/(FW2-FW3) which describes the frequency shift per fine tuning word.

With knowledge of the frequency difference between $F_1$ and the requested target frequency, the quantities $\Delta F_{coarse}$ and $\Delta F_{fine}$ can be applied to CW1 and FW1 to compute the corresponding coarse and fine word increments needed therefrom to tune the VCO substantially to the requested target frequency. In a particular embodiment, the coarse word increment added to CW1 to tune from F1 to the target frequency is computed as the truncated integer value of the quantity:

$$\Delta_{CW} = \left[\frac{F_{Target} - F_1}{\Delta F_{Coarse}}\right]_{Integer, Truncated} \qquad \text{eq. (13)}$$

Thus, for example, if the coarse word increment is 2.9, the output value of eq. (13) would be 2.0.

Further, the fine word increment added to FW1 is computed as the rounded integer value of the quantity:

$$\Delta_{FW} = \left[\frac{F_{Target} - F_1 - (\Delta_{CW} * \Delta F_{Coarse})}{\Delta F_{fine}}\right]_{Integer, Rounded} \qquad \text{eq. (14)}$$

Thus, for example, if the coarse word increment is 2.9, the output value of eq. (14) would be 3.0. The numerator of the quantity represents the residual coarse word.

In a particular embodiment, the computations are performed as a part of process 854, in which the VCO is re-tuned to $F_1$, the new coarse and fine tuning words corresponding to the target frequency computed as shown in eqs. (13) and (14), and the VCO closed looped tuned to substantially the target frequency using the computed coarse and fine tuning coarse words.

Subsequent to close loop tuning to substantially the target frequency, the VCO tuning voltage is optionally measured to determine if it lies within an acceptable range of $V_{T1}$ Variance of the VCO's operation from the linear approximation of the above coarse and fine words may result in the actual VCO frequency being offset from the desired target frequency. In this case, one or more fine tuning capacitors may be connected or disconnected (to achieve a lower or higher tuning frequency, respectively), and the tuning voltage and locked frequency re-measured to determine if each lies within an acceptable range. In a particular embodiment, the fine tuning process is performed as an open loop process in which the VCO is allowed to vary between frequencies to achieve look, as the fine tuning operation occurs over a small frequency range which may not produce a significant frequency overshoot effect to disturb neighboring frequencies. However, if such a condition is found or would be expected, the fine tuning procedure could be carried out as a closed loop lock operation in the same manner as the coarse tuning.

Figure 8C:
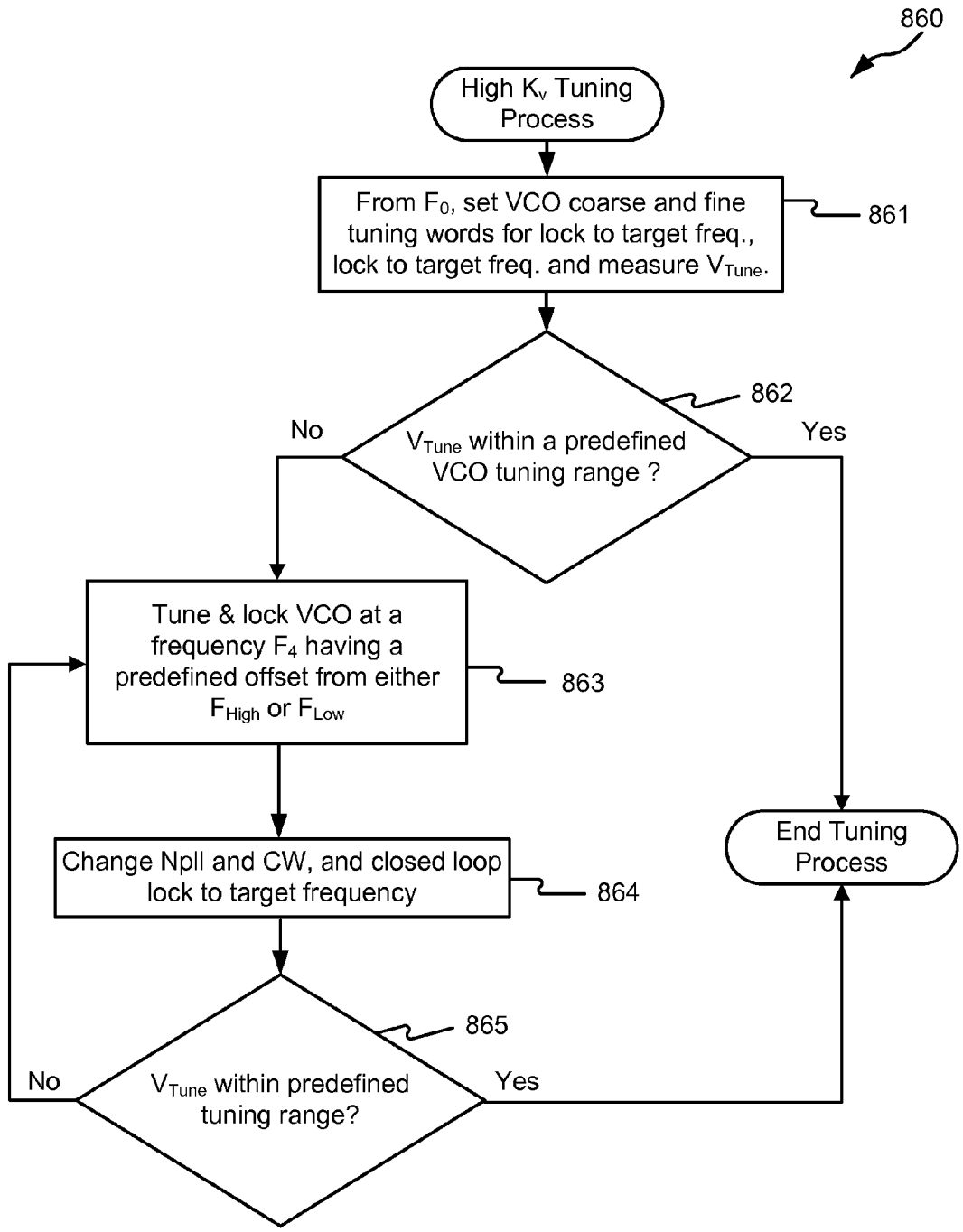
FIG. 8C illustrates an exemplary embodiment of a process for tuning a high $K_v$ voltage controlled oscillator to the requested target frequency residing between two closely spaced existing frequencies in accordance with the present invention.

FIG. 8C illustrates an exemplary embodiment of process 860 for tuning a high $K_V$ VCO to the requested target frequency residing between two closely spaced existing frequencies $F_{Low}$ or $F_{High}$ in accordance with the present invention. The process begins at 861, whereby the selected VCO is provided coarse and fine tuning words for performing a closed loop lock to the target frequency. As noted above, the closed loop lock tuning operation across the pre-existing frequency provides the least disturbance to the existing frequency. The process by which the coarse and fine tuning words corresponding to the target frequency are selected may be as described in processes 851-855 in FIG. 8C.

At 862, a determination is made as to whether the VCO tuning voltage is within an acceptable range, 1.25V to 1.75V in an exemplary embodiment. If not, a new frequency $F_4$ within the present VCO tuning band (i.e., same CW) is tuned to (process 863). In an exemplary embodiment, $F_4$ is chosen at predefined offset from either $F_{Low}$ or $F_{High}$, an exemplary offset being in the range from 500 KHz-5 MHz.

At 864, a CW and frequency (divider ratio Npll) for tuning to the target frequency is supplied to the VCO, and the VCO performs a closed loop jump from $F_4$ to the target frequency using the new CW. In a particular embodiment of this process, the coarse and fine tuning words are latched substantially concurrently with the value of the dividing ratio Npll, in a closed loop environment. At 865, the VCO tuning voltage is measured to determined if it is within an acceptable ranges, e.g., 1.25 V<$V_{Tune}$<1.75 V. If the condition is not met, the process returns to 863, in which the VCO is close loop tuned back to frequency $F_4$ using intermediate frequency tuning process. The process repeats as shown until the conditions are met, at which point the process concludes.

II. Exemplary System Components

System Microcontroller

Figure 9:
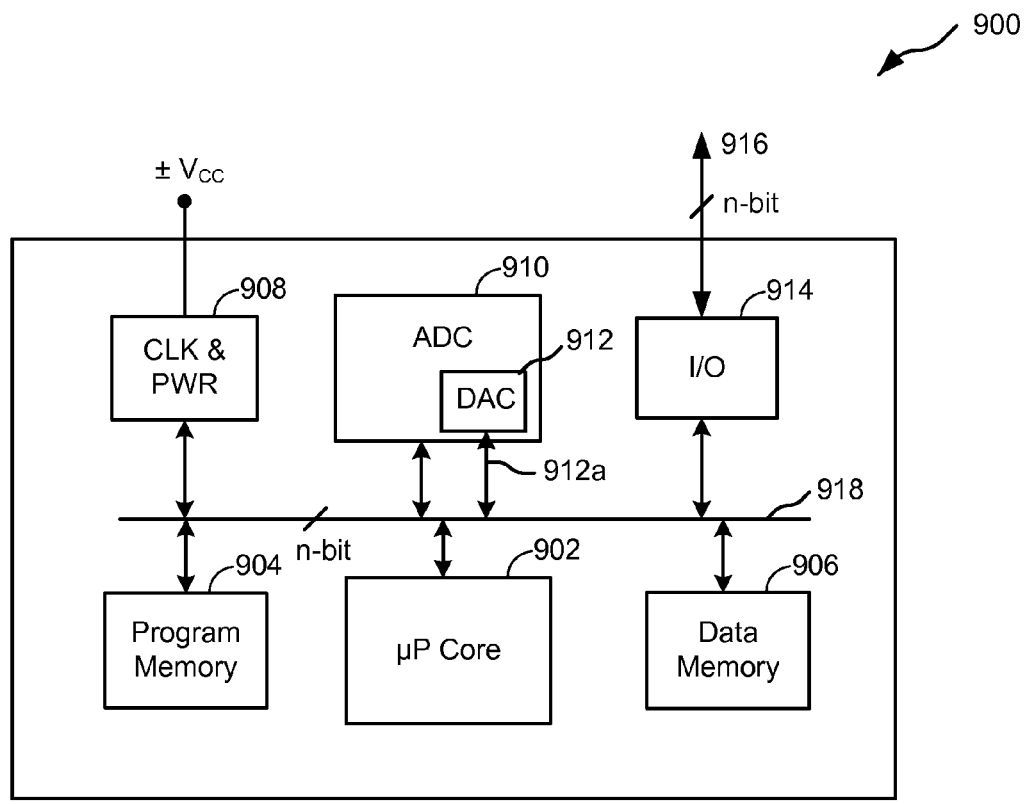
FIG. 9 illustrates a block diagram of an exemplary system microcontroller operable to control the multiple frequency source system in accordance with the present invention.

FIG. 9 illustrates a block diagram of an exemplary system microcontroller operable to control the multiple frequency source system in accordance with the present invention. The microcontroller 900 includes a microprocessor core 902 operable to run one or more programs to execute the tuning operations and processes described herein, a program memory 904 (typically non-volatile or programmable ROM) operable to store, for example, the data structures of 360 and 370 shown in FIGS. 3A and 3B and programs for performing the tuning procedures as set forth herein, and a data memory 906 (typically RAM) operable to store, for example, the data values of data structures 360 and 370.

The microcontroller 900 further includes a system clock and power management unit 908 for controlling the system clock and power consumption, an analog-to-digital converter unit 910 for providing digital conversion of supplied analog signals, the ADC 910 further including an embedded digital-to-analog converter (DAC) unit 912 used to pre-charge the loop filter to a desired level, further described below, and an input/output module 914 for receiving and transmitting data, power, control, and other information and signals to the system of the present invention via an n-bit I/O bus line 916. The microcontroller itself includes an internal n-bit bus line which interconnects the microprocessor core 902, program and data memory units 904 and 906, the clock and power management module 908, the ADC 910 and DAC 912, and the I/O unit 914. In a specific embodiment of the invention further described below, the DAC 912 is operable both as a part of the ADC unit 910, and as a separate DAC unit, the later functionality being provided by a DAC bus line 912a coupled to the internal microcontroller bus 918.

The microcontroller 900 may be fabricated integrally with one or more of the frequency sources, or separately therefrom, for example as an application specific integrated circuit (ASIC). Still further alternatively, one or more functions of the microcontroller 900 may be integrated within or proximate to one or more frequency sources, the other functions residing on a remotely-accessible circuit or integrated circuit. Those skilled in the art will appreciate that the illustrated microcontroller is only exemplary and can be modified in a variety of ways to provide the desired system functionality and control. Alternatively, the microcontroller 900 may be omitted in those designs in which the functionality and control of the multiple frequency source system is provide using other means.

Voltage Controlled Oscillator

FIG. 10 illustrates an exemplary embodiment of an oscillator 124 in accordance with the present invention. The oscillator, illustrated as a VCO, includes oscillator transistors 1002 and 1004 arranged in a differential configuration, a tank circuit 1010, and a bank of fine tune capacitors 1030. In one embodiment, each of these components are monolithically fabricated in a bipolar-complementary metal oxide semiconductor (Bi-CMOS) process, although those of skill in the art will appreciate that the circuit may be formed in other materials and processes (e.g., CMOS, SiGe, GaAs), as well as in monolithic, hybrid, or discrete form. Furthermore, the oscillator 124 may be integrated with one of more of the phase-frequency detector 121, the charge pump circuit 122, the loop filter 123, the divide-by-N counter 126, and/or the sigma delta modulator 127.

Oscillator transistors 1002 and 1004 provide negative resistance to compensate for the losses of the tank circuit 1010, thereby allowing the VCO 114 to oscillate. In the illustrated embodiment, oscillator transistors 1002 and 1004 are p-type metal oxide semiconductor (PMOS) transistors having their respective source terminals coupled together and to the power supply through supply resistor R1. Drain terminals are coupled to respective ports of the tank circuit, the gate terminals of opposing transistors coupled to the other's drain terminal. While oscillator transistors 1002 and 1004 are illustrated as PMOS transistors, other FET transistor embodiments such as NMOS, as well as bipolar transistor architectures may be used in alternative embodiments under the present invention.

VCO tank circuit 1010 includes varactor diodes D1 and D2, capacitors C1 and C2, and inductor L1, operable to provide the desired resonant frequency over a range of frequencies as assisted by the variable capacitor of the varactor diodes D1 and D2. A tuning voltage $V_{Tune}$ is supplied to the varactor diodes D1 and D2 to set the capacitance of the tank circuit, thereby setting the resonant frequency of the oscillator 124.

While the illustrated embodiment illustrates a variable reactance tank circuit commonly used in voltage controlled oscillator circuits, the oscillator 124 is not limited thereto, and a tank circuit having a fixed resonant frequency may be used in an alternative embodiment of the invention. Moreover, the invention is not limited to any particular tank circuit configuration, as any resonant circuit, active or passive, parallel or series-coupled, can be used with the present invention. In embodiments in which n-type FETs (field effect transistors) or BJTs (bipolar junction transistors) are employed, $V_{DD}$ and ground potentials are reversed, e.g., inductor L1 is coupled to $V_{DD}$ and resistor R1 coupled to ground.

An exemplary embodiment of the coarse tuning capacitor bank 1020 includes capacitors $C_c$ series coupled via a NMOS switch FET. In a particular arrangement, the capacitor bank 1020 includes a binary progression as to the size of tuning capacitors, the next row of capacitors employing capacitors of size $2^1 \times C_c$, and so forth. Coarse tuning capacitors of a different size may be alternatively used. Further, the capacitor bank 1020 may employ any number of rows to provide further tuning capability. The gate terminal of FET switches $SW_{C1-n}$ receive a coarse tuning control word, and responsive thereto, connect or disconnect the particular coarse tuning capacitor row, thereby lowering or raising, respectively, the oscillator's operating frequency. Alternative embodiments of the exemplary switches $SW_{C1-n}$, include PMOS FETs, BJTs, diodes, or any passive or active component having equivalent functionality.

An exemplary embodiment of the fine tuning capacitor bank 1030 includes capacitors $C_f$ series coupled via a NMOS switch FET. In a particular arrangement, the fine tuning capacitor bank 1030 includes a linear progression as to the size of tuning capacitors. In an alternative embodiment, capacitors of a different size may be alternatively used. Further, the fine tuning capacitor bank 1030 may employ any number of rows to provide further tuning capability. The gate terminal of FET switches $SW_{F1-n}$ receive a fine tuning control word, and responsive thereto, connect or disconnect the particular fine tuning capacitor row, thereby lowering or raising, respectively, the oscillator's operating frequency. Alternative embodiments of the exemplary switches $SW_{F1-n}$, include PMOS FETs, BJTs, diodes, or any passive or active component having equivalent functionality.

The illustrated oscillator is only exemplary of one type of tunable oscillator which can be used in the present invention. Those skilled in the art will appreciate that other types of tunable oscillators may be alternatively employed. Furthermore as noted above, one or more fixed frequency sources may be implemented in the multiple frequency source system, each of the fixed frequency sources including a fixed frequency oscillator, some examples of which include L-C oscillators, crystal oscillators, dielectric resonator oscillators, and the like.

Multi-Mode Loop Filter

Figure 11:
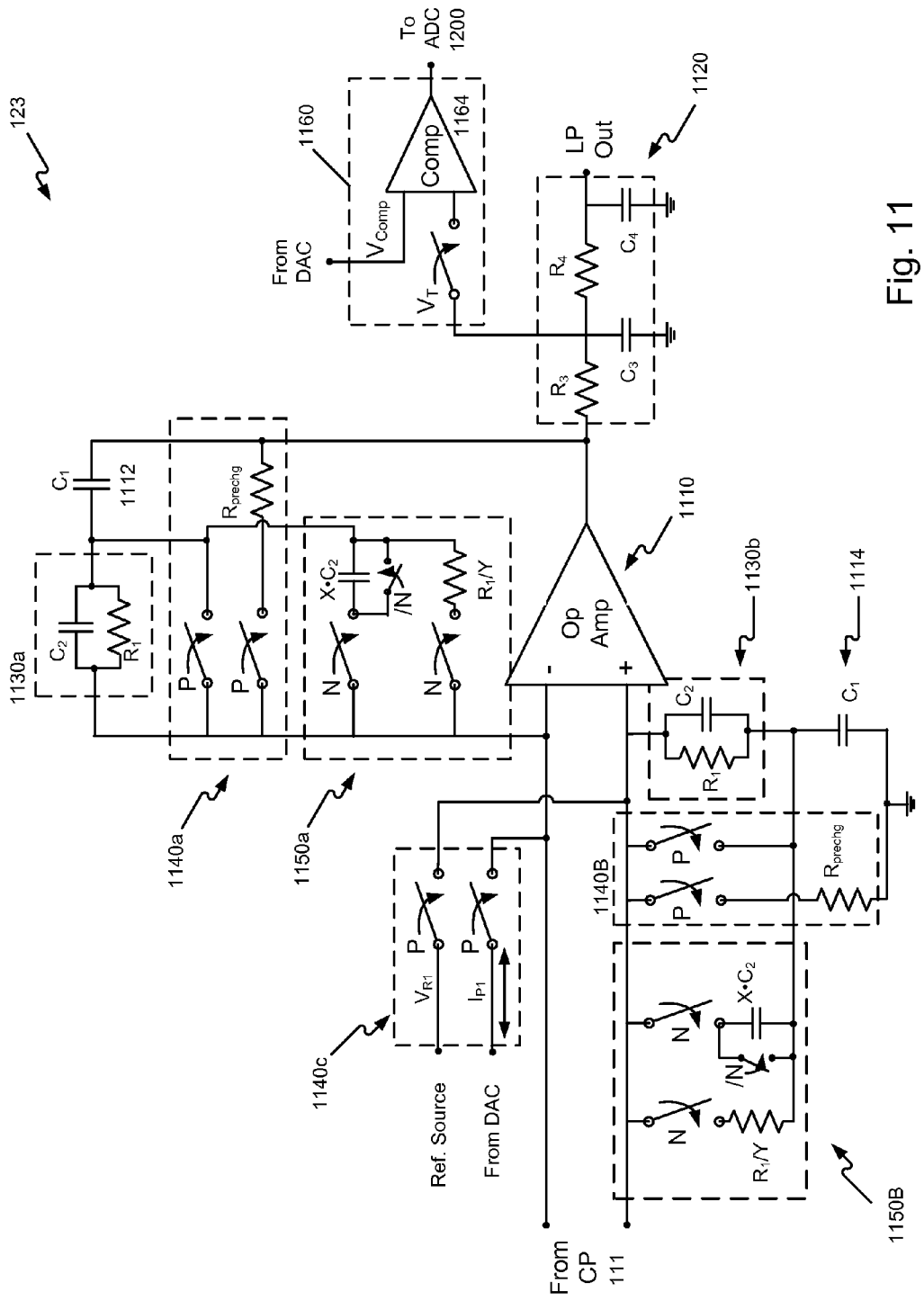
FIG. 11 illustrates an exemplary embodiment of a multi-mode loop filter in accordance with the present invention.

FIG. 11 illustrates an exemplary embodiment of the loop filter 123 which is operable in multiple modes in accordance with the present invention. As illustrated, the loop filter 123 includes an operational amplifier 1110 having inverting and non-inverting inputs 110a and 1110b coupled to receive complementary charge pump signals output from the phase-frequency detector 110. The loop filter 123 further includes a first op-amp capacitor 1112 coupled between the inverting input 110a and the output 1110c, and a second op-amp capacitor 1114 coupled between the non-inverting input 1110b and signal ground. First and second op-amp capacitors 1112 and 1114 are substantially the same value C1 in an exemplary embodiment, although capacitors of different values may be used in alternative embodiments. The loop filter 123 further includes low frequency overshoot mode circuitry 1130, pre-charge mode circuitry 1140, normal tuning mode circuitry 1150, and VTune measurement circuitry 1160. Optionally, output circuitry 1120 (shown as an exemplary second order filter) is coupled to the operational amplifier output 1120c for providing additional attenuation of spurious products. As noted above with regards to the oscillator 124, the loop filter 123 may be implemented in an integrated circuit in combination with one or more of the phase-frequency detector 121, the charge pump circuit 122, the oscillator 124, the divide-by-N counter 126, and/or the sigma-delta modulator 127. Alternatively, one or more of the loop filter components may be implemented as discrete, off-chip components.

Low Overshoot Tuning Mode

The low overshoot tuning mode (low overshoot) circuit 1130 is used during oscillator tuning operations proximate to existing frequencies, such as in operations 531 -535 in FIG. 5C. The loop bandwidth provided by this circuit is generally narrower than that provide by the normal tuning mode circuit (described below) in order to produce less frequency overshoot which could interfere with existing frequency(ies) lying nearby.

The low overshoot circuit 1130 includes a first circuit 1130a configured to couple between the inverting input 110a and the first op-amp capacitor 1112, and a second circuit 1130b configured to couple between the non-inverting input 1110b and the second op-amp capacitor 1114. As used herein, the terminology "configured to couple" includes the embodiment in which the signal path is completed via fixed route, as well as the embodiment in which the signal path is completed by a switch or switching means. In the illustrated embodiment, the first and second circuits 1130a and 1130b are coupled via a fixed connection, although in other embodiments the connection may be made by means of a switch.

In an exemplary embodiment each of the first and second low overshoot mode circuits 1130a and 1130b include a parallel-coupled capacitor $C_2$ and resistor $R_1$. In other embodiments, each of the circuits 1130a or 1130b may comprise other circuit configurations, as well as employ active or passive circuit components. As an example, a series-coupled RC combination coupled in parallel with a capacitor could be alternatively used. As will be further explained below, the low overshoot mode circuitry 1130 is operable to provide a filter characteristic which produces less frequency overshoot compared to that produced when the loop filter operates in a normal oscillator tuning configuration.

Pre-Charging Mode

The pre-charge circuit 1140 includes a first pre-charge circuit 1140a configured to coupled between the inverting and output terminals of the operational amplifier 1110, a second pre-charge circuit 1140b configured to couple between the non-inverting terminal of the operational amplifier 1110 and signal ground, and a third pre-charge circuit 1140c configured to coupled to the operational amplifier's inverting and non-inverting inputs 1110a and 1110b. Filter pre-charging is performed to reduce charge distribution within the loop filter, which, if left unattended, can cause severe frequency glitches and overshoot when switching between low overshoot and normal tuning modes of operation.

In a particular circuit configuration, each of the first and second pre-charging circuits 1140a and 1140b includes a pre-charging resistor $R_{prechg}$, and a switch operable to discharge capacitor $C_2$ when the loop filter is operating in the pre-charging mode. A reference voltage $V_{R1}$ is supplied to the non-inverting input of the operational amplifier 1110 from a reference source, which may be a part of the loop filter, supplied from the DAC, or located elsewhere in the system. A digital-to-analog converter is used to supply a predefined current $I_{P1}$ to, or sink the predefined current $I_{P1}$ from, the inverting input of the operational amplifier 1110. Accordingly, the pre-charge voltage at the output of the operational amplifier 1110 will be substantially:

$$V_{prechg} \approx V_{R1} \pm I_{P1} * R_{prechg} \qquad \text{eq. (15)}$$

the addition or subtraction operation depending upon whether current is supplied to or sunk from the non-inverting op-amp input terminal, assuming a high gain, high impedance operational amplifier. Thus, the precharge voltage $V_{prechg}$ can be controlled by fixing voltage $V_{R1}$ and controllably varying current $I_{P1}$, although controllably varying $V_{R1}$ and fixing $I_{P1}$ may be used in an alternative embodiment.

In the exemplary embodiment shown, pre-charge operations are performed by closing the P switches, and are discontinued by opening the P switches. In one embodiment, e.g., processes 516 and 521 shown in FIG. 5B, the pre-charge current $I_{P1}$ is a current operable to set $V_{prechg}$ to the lowest tuning voltage $V_1$, $V_1$ corresponding to the lowest oscillator tuning frequency applied in processes 516 and 521. In another embodiment, e.g., processes 616 and 621 shown in FIG. 6B, the pre-charge current IP1 is a current operable to set $V_{prechg}$ to the highest tuning voltage $V_2$, corresponding to the highest oscillator tuning frequency applied in processes 516 and 521. In another embodiment of the invention, the charge pump circuit 122 is operationally disconnected during pre-charge operations.

Normal Tuning Mode

The normal tuning mode circuit 1150 is used during the oscillator's normal tuning operations. The loop bandwidth provided by this circuit is generally optimized to provide a good balance between loop stability and lock time and noise performance. This tuning mode is normally employed when lock acquisition of the oscillator/VCO is not expected proximate to any existing frequencies. In such instances in which acquisition of the VCO locked frequency is expected close to an existing frequency, the low overshoot tuning mode is implemented. Once tuning and lock to an adjacently-located frequency is achieved, the loop filter returns to the normal tuning mode at the frequency.

In the exemplary embodiment shown, normal tuning operations are performed by closing the N switches and opening the /N switches, and are discontinued by opening the N switches and closing the /N switches. Switching between the low overshoot and normal tuning mode provides a glitch, which is reduced by complementary normal tuning mode switches /N to discharge capacitor $X*C_2$ when the normal mode is not employed. Glitches are further reduced when switching into/out of the pre-charging mode, as pre-charge switches are operable to discharge capacitor $C_2$ during pre-charge operations. In an alternative embodiment, the respective N switches are replaced by fixed connections, and the low overshoot mode circuit 1130 is implemented via switchable connections.

The normal tuning mode circuit 1150 includes a first circuit 1150a configured to couple between the inverting input 1110a and the first op-amp capacitor 1112, and a second circuit 1150b configured to couple between the non-inverting input 1110b and the second op-amp capacitor 1114. In the exemplary embodiment shown, each of the first and second circuits 1150a and 1150b include a parallel-coupled capacitor and resistor having values $X*C_2$ and $R_1/Y$, these values representing scaled values of the parallel-coupled capacitor resistor pair of the first and second low overshoot circuits 1130a and 1130b. Optionally, each of the first and second normal tuning circuits 1150a and 1150b include a switch coupled across the parallel capacitor $X*C_2$, the switch operating complementary from the switch coupling in the normal tuning circuits 1150a and 1150b. This complementary-operating switch is operable to discharge the capacitor during periods when the normal tuning circuits are disconnected from the loop filter further reducing charge redistributing and frequency overshoot effects when the normal mode is switched on or off.

As can be seen from the illustrated capacitance and resistance values, the impedance of the normal mode circuits 1150a and 1150b is lower than that of the low overshoot circuits. This relationship provides a filter function for the normal tuning mode which provides a faster settling time, while the low overshoot circuits alternatively provide less frequency overshoot. In a particular embodiment of the invention, X is greater than a factor of 5, i.e., the capacitor of the first and second overshoot tuning circuits is at least five times higher in reactance than the capacitance of each of the first and second normal tuning circuits. Further particularly, Y is greater than a factor of 3, i.e., the resistor of each of the first and second low overshoot tuning circuits is at least three times higher than the resistor of each of the first and second normal tuning circuits. In specific embodiments, X is a factor 10, and Y is a factor 6. Of course, other factors for each X and Y may be used in alternative embodiments under the invention.

VTune Read Mode

The tuning voltage measurement ($V_{Tune}$) circuit 1160 is configured to couple to the output of the operational amplifier. In the exemplary embodiment shown, the tuning voltage is measured by tapping the output of the operational amplifier, closing switch $V_T$, and comparing that tapped voltage to a voltage $V_{Comp}$ through the use of a comparator 1162. In a particular embodiment of the invention, the reference voltage $V_{Comp}$ is supplied by a dual use digital-to-analog converter, further described in FIG. 12 below. In an alternative embodiment, the reference voltage $V_{Comp}$ may be generated using a voltage or current source. The compared voltage is supplied to an analog to digital converter to obtain a relative measurement of the tuning voltage in digital format.

In a particular embodiment of the invention, all of the switch groups P, N and $V_T$ are open and the loop filter operates in a low overshoot tuning mode as described above. In another embodiment, one of the switch groups P, N or $V_T$ is closed to perform the corresponding functions associated with that switch group, and the rest of the switch groups are open. In another embodiment, switches N in the normal tuning mode circuitry are replaced by fixed connections, and the low overshoot mode circuitry is altered to be switchably coupled into the operational amplifier. In this embodiment, either a single switch is used to couple to a common node of the parallel-coupled capacitor resistor pair $C_2$ and $R_1$, or individual switches are used to connect to each of the resistor $R_1$ and capacitor $C_2$.

While the exemplary loop filter 114 is operable in each of the four modes, alternative embodiments may be used in which one or more of these modes and their corresponding circuitry is omitted. For example, another embodiment of the loop filter may employ the low overshoot and normal tuning modes and circuitry. In still another embodiment, the loop filter may employ the normal tuning and tuning measurement modes and circuitry. It will be appreciated that further embodiments in which two or more of the four described modes and circuitry are possible in alternative embodiments under the present invention.

Analog-to Digital Converter with Dual-Use DAC

Figure 12:
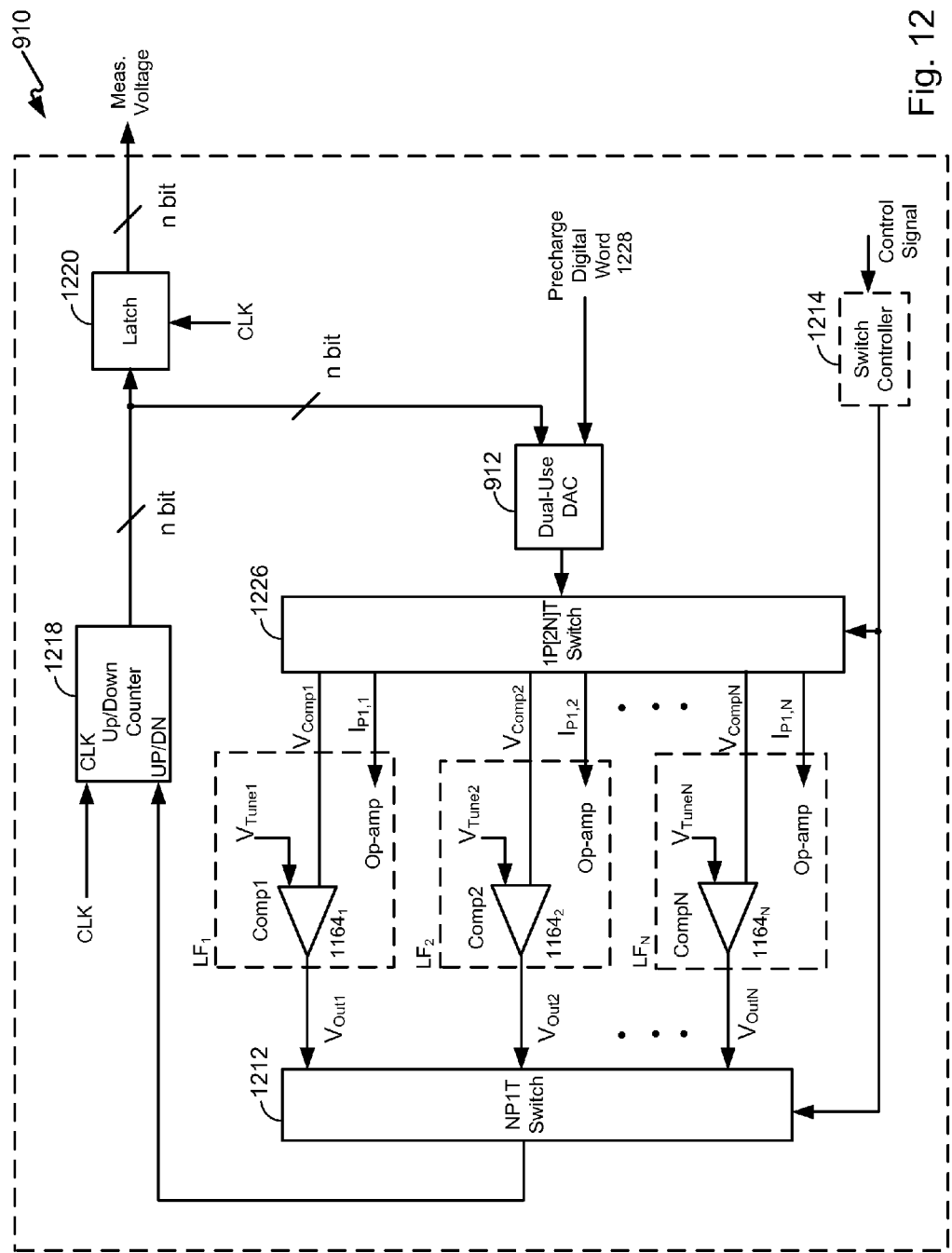
FIG. 12 illustrates an exemplary embodiment of an analog-to-digital converter employing a dual use digital-to-analog converter in accordance with the present invention.

FIG. 12 illustrates an exemplary embodiment of an analog-to-digital converter (ADC) 910 employing a dual use digital-to-analog converter (DAC) 912 in accordance with the present invention, the ADC 910 and DAC 912 being previously shown in FIG. 9. The ADC 910 employs the dual use DAC 912 to provide both the digital-to-analog functionality for generating the desired pre-charge current IP1 as well as serving as a DAC building block for the analog-to-digital converter used in the tuning measurement process.

Turning first to the operation of the ADC 910 when used in a tuning voltage measurement process, a tuning voltage $V_{Tune}$ is developed at the output of each PLL loop filter $LF_{1-N}$. Within each loop filter, a comparator 1164 is operable to compare the values of the tuning voltage $V_{Tune}$ to a voltage $V_{Comp}$ supplied by the ADC 910. The result of the comparison, $V_{Out}$, is supplied to an n-pole, single throw switch 1212, the input routing of which is controlled by switch controller 1214. The desired $V_{Out}$ signal is coupled to the output of switch 1212, and into an up/down counter 1218. The up/down counter 1218 also receives a clock signal input, and outputs a digital word n bits wide (e.g., 7 bits) which is supplied to a latch 1220. A clock signal is supplied to the latch 1220 to output the received digital word, that word representing the voltage level of $V_{Out}$. The n bit digital word is additional supplied to the dual-use DAC 912. The dual-use DAC 912 converts the $V_{Out}$ digital word into an analog voltage signal $V_{Comp}$, which is supplied to a single pole, 2N throw switch 1226. The output routing of the 1P[2N]T switch 1226 is controlled by switch controller 1214 to route the analog voltage signal $V_{Comp}$ to the appropriate PLL Loop filter, where the aforementioned process repeats. In such a manner, the tuning voltage $V_{Tune}$ is measured accurately.

In its second operational mode, the dual-use DAC 912 is operable to convert a received precharge digital word 1228 into the precharge current IP1, described above. During a pre-charging operation, a pre-charge digital word 1228 is supplied to the dual-use DAC 912. The pre-charge digital word 1228 may be of any width which represents the desired analog current value $I_{P1}$. The DAC 912 receives and converts the pre-charge digital word 1228 into a corresponding analog current $I_{P1}$ which is, in turn, supplied to the 1P[2N]T switch 1226. The output routing of switch 1226 is controlled by switch controller 1214 to supply $I_{P1}$, to the appropriate PLL loop filter $LF_{1-N}$ where it is applied to the precharge resistor $R_{prechg}$ and the first op-amp capacitor $C_1$ 1112.

Direction Control Circuit for Phase-Frequency Detector

Figure 13A:
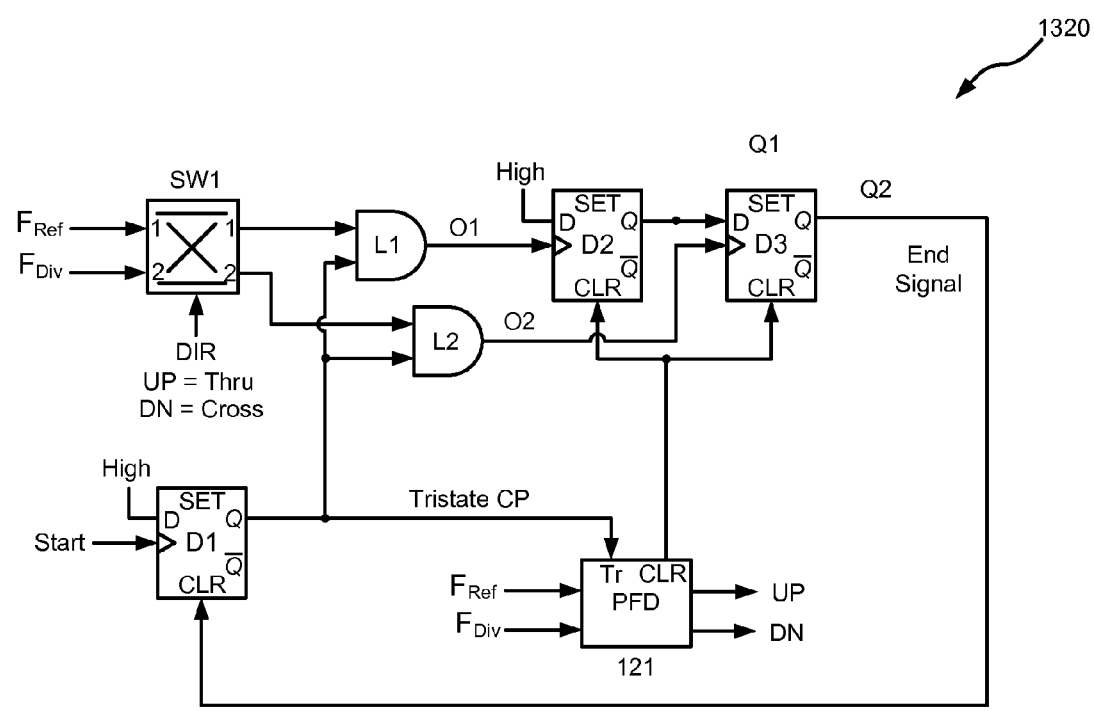
FIG. 13A illustrates an exemplary embodiment of a direction control circuit for use with a phase-frequency detector in accordance with the present invention.

FIG. 13A illustrates an exemplary embodiment of a direction control circuit 1320 for use with the phase-frequency detector circuit 121 in accordance with the present invention. The circuit 1320 includes a 2×2 crosspoint switch SW1, first, and second AND logic gates L1 and L2, and first, second and third edge-triggered D-flip flops D1 and D2, and D3. The phase-frequency detector 121, early described is shown to illustrate signal routing and connectivity and may be separately form or distally-located from the direction control circuit 1320. In a particular embodiment, however, the direction control circuit 1320 and the phase-frequency detector circuit 121 are monolithically formed on an integrated circuit.

The crosspoint switch SW1 has first and second inputs (denoted by 1 and 2) for receiving $F_{Ref}$ and $F_{Div}$ signals as generated by the PLL. Crosspoint switch SW1 further receives a direction signal DIR specifying the desired oscillator tuning direction, i.e., either increasing or decreasing in frequency. The process of directionally tuning the oscillator is used, for example, in processes 510 and 610 illustrated in FIGS. 5B and 6B above. In a particular embodiment shown, the direction signal DIR is selectable between (i) an "UP" state, in which the crosspoint switch SW1 operates in a "thru" state, whereby the $F_{Ref}$ signal at input terminal 1 is passed to output terminal 1, and the $F_{Div}$ signal at input terminal 2 is passed to output terminal 2, or (ii) a down or "DN" state in which the crosspoint switch SW1 operations in a crosspoint state, whereby the $F_{Ref}$ signal at input terminal 1 is passed to output terminal 2 and the $F_{Div}$ signal at input terminal 2 is passed to output terminal 1. The foregoing is only exemplary, and certainly other embodiments of control signals and switches may be employed in a functionally equivalent manner in the present invention.

First D flip-flop D1 has a clock input to receive a START signal for beginning the process, a D input coupled to a fixed high state signal, a clear input for receiving an end signal, and a Q output for providing a tristate signal to the PFD circuit 121. The tristate signal disables the PFD circuit 121 for a particular duration in order to provide the correct transition on which the PFD circuit 121 triggers. Exemplary embodiments of this operation are presented below.

First and second logical AND gates L1 and L2 each have one input coupled to respective outputs of the crosspoint switch SW1, and one input coupled to receive signal tristate CP1. First logical AND gate L1 provides a signal O1 to the clock input of the second D flip-flop D2, the second D flip-flop D2 further including a D input coupled to a fixed high state signal, a clear input coupled to receive signal CLR from the PFD circuit 110, and a Q output for providing signal Q1. Second logical AND gate L2 provides a signal O2 to the clock input of the third D flip-flop D3, the third D flip-flop D3 further including a D input coupled to receive signal Q1, a clear input coupled to receive signal CLR from the PFD circuit 110, and a Q output for providing signal Q2 (END signal) which operates to clear the state of the first D flip-flop D1.

Figure 13B:
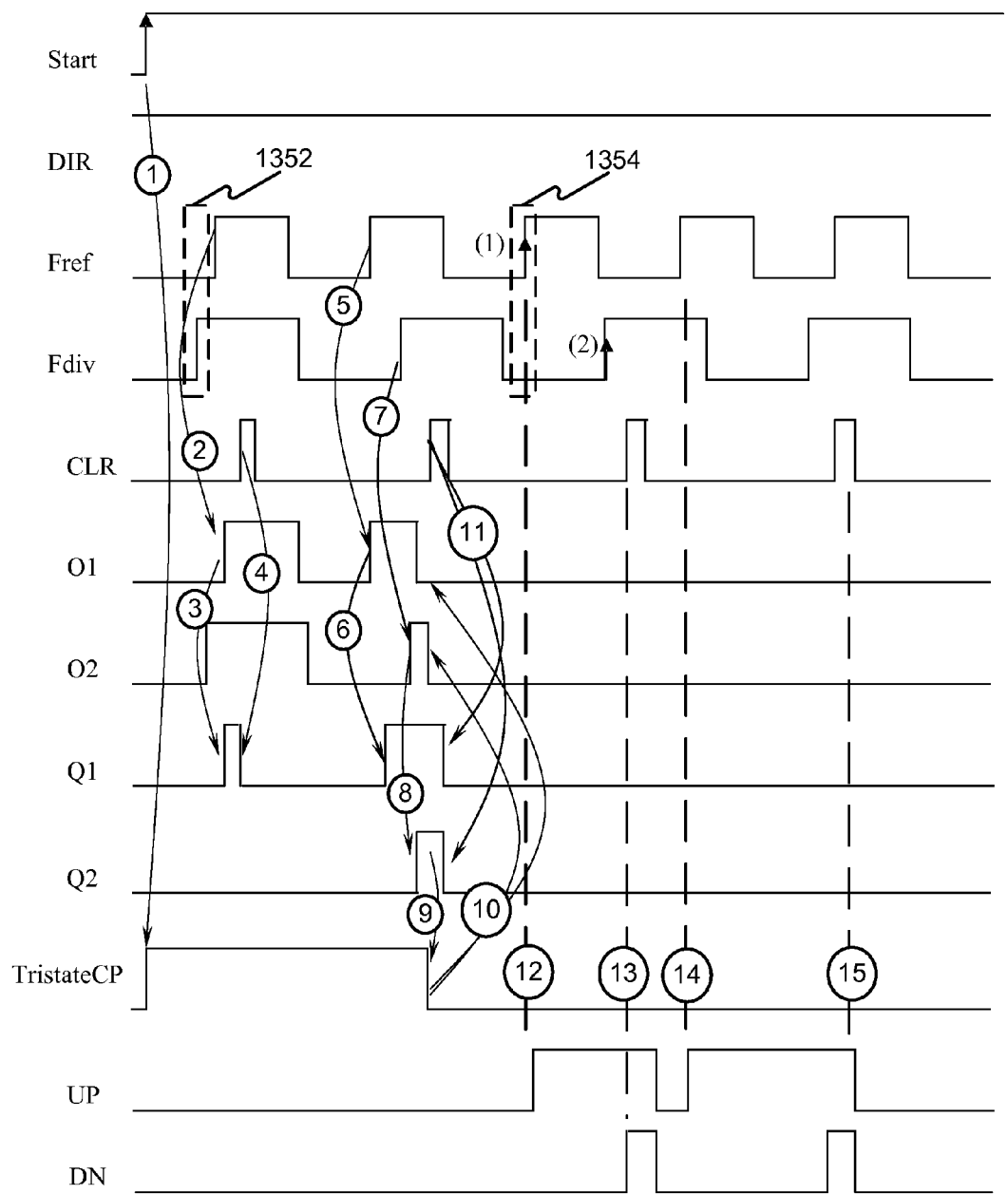
FIG. 13B illustrates the operation of the direction control circuit signals to avoid a transient frequency decrease when the oscillator is instructed to tune higher in frequency in accordance with the present invention.

FIG. 13B illustrates the operation of the direction control circuit signals to avoid a transient frequency decrease when the VCO is instructed to tune higher in frequency in accordance with the present invention. As shown, the reference frequency signal FRef operates higher in frequency, but delayed in phase compared to the divided frequency signal $F_{Div}$. Accordingly, it is desired that the PFD circuit 121 operate to increase the VCO tuning frequency and avoid a transient down state which could cause the VCO to decrease the tuning frequency.

The process is illustrated in terms of fifteen operations as depicted in FIG. 13B. Initially at operation 1, the START signal is supplied to the first D flip-flop D1, which further produces signal tristate at a high state. As the D input of D1 is fixed at a high state, signal tri-state remains in the high state until the END signal is raised high to clear D1.

Signals FRef and FDiv are supplied to crosspoint switch SW1, the direction of which is chosen UP. As shown, the UP direction of switch SW1 correlates to a high state signal, although a low state signal may be used alternatively. In the illustrated UP state, crosspoint switch SW1 operates in a thru mode, in which $F_{Ref}$ is passed thru from the first input to the first output, and signal $F_{Div}$ passed thru from the second input to the second output.

At operation 2, the first logical AND gate L1 receives high state signals $F_{Ref}$ and tristate CP, and accordingly produces high state signal O1. As the D input of second flip-flop D2 is held high, upon receipt of the high state clock signal O1, D2 produces high state signal Q1 (operation 3). Detection of the rising edge of $F_{Div}$ activates (after some delay) the output of a CLR signal output from the PFD circuit 121, which resets Q1 to a low state.

The rising edge of signal FRef and continued high state of signal tristate produces a high state signal O1 (operation 5), which in turns produces a high state signal Q1 (operation 6). The rising edge of signal $F_{Div}$ and continued high state of signal tristate produces a high state signal O2 (operation 7), which in combination with concurrently occurring high state Q1, produces a high state signal Q2 (END signal) which clears D1, and returns the tristate signal to a low state (operation 9). A low tristate signal results in low state O1 and O2 signals (operation 10). After some delay, detection of the rising edge of $F_{Div}$ at operation 7 results in the output of a CLR signal from the PFD circuit 110, thereby resulting in signals Q1 and Q2 returning to their low states.

Referring now to the bottom traces labeled UP and DN illustrating the output state of the PFD circuit 110, the tristate signal disables the operation of the PFD circuit 121 during its high state, and accordingly avoids the DN transient condition 1352 whereby the rising edge of the $F_{Div}$ signal rises to a high state. Instead, the intended direction of VCO tuning is achieved at transition 1354 where, after the tristate signal returns to a low state, the rising edge of $F_{Ref}$ signal occurs, resulting in the intended high state UP signal (operation 12). VCO frequency is increased during a high UP state and low DN state until some delay after the rising edge of $F_{Div}$ is detected, at which point the PFD circuit generates a CLR signal, producing a high state DN signal (operation 13). In a particular embodiment of the invention, the PFD circuit 121 does not output a charge signal when the UP and DN signals are in the same state. The CLR signal and the high state level of the DN signal last substantially the same duration, after which the UP and DN signals return to a low state. Upon the rising edge of $F_{Ref}$ at operation 14, the UP signal returns to a high state, where it remains until the rising edge of $F_{Div}$ triggers the generation of a CLR signal, which at operation 15, results in the UP signal returning to a low state.

Figure 13C:
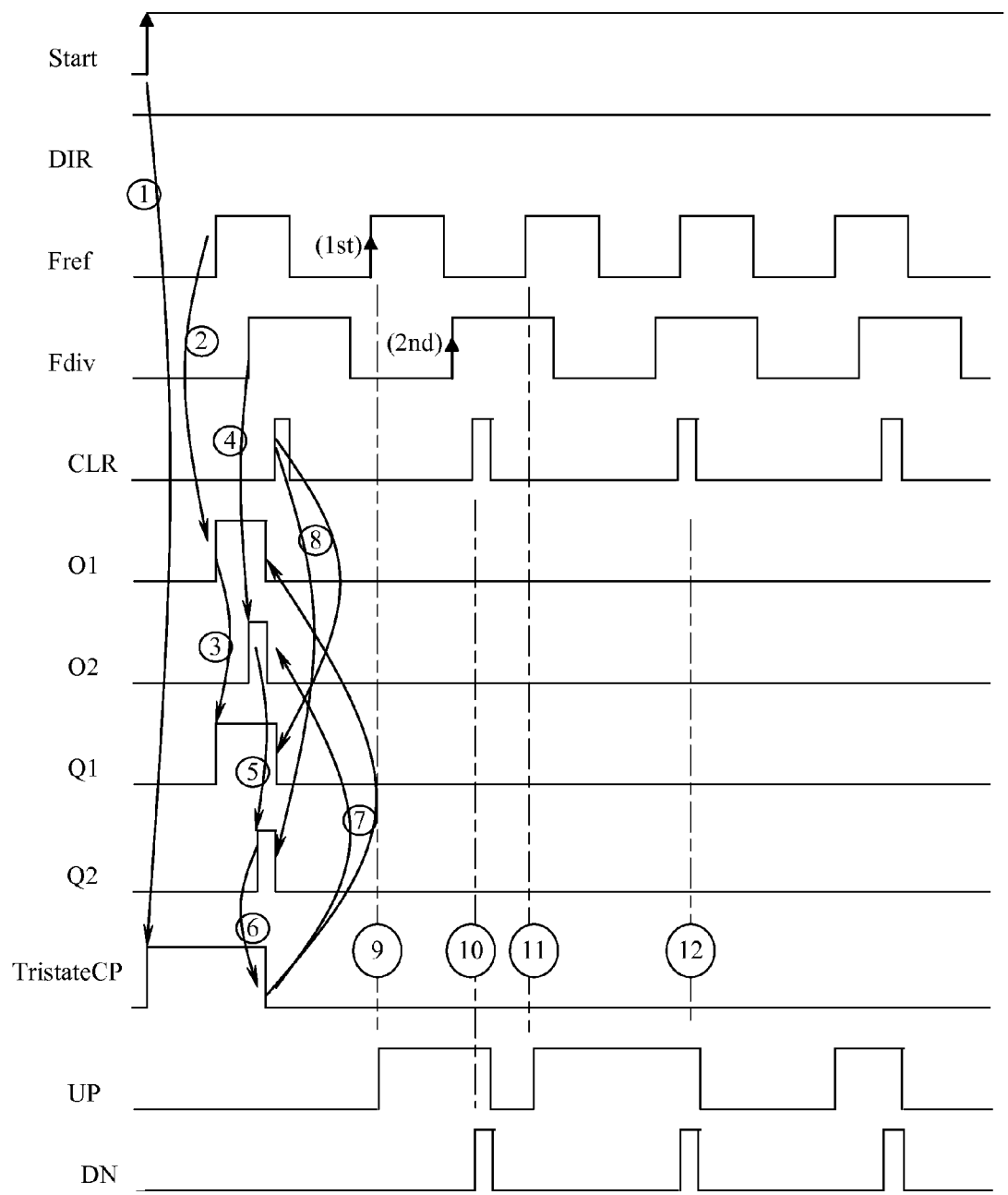
FIG. 13C illustrates the operation of the direction control circuit signals in a normal mode to tune higher in frequency in accordance with the present invention.

FIG. 13C illustrates the operation of the direction control circuit signals in a normal mode to tune higher in frequency in accordance with the present invention. As shown, the reference frequency signal $F_{Ref}$ operates higher in frequency, but delayed in phase compared to the divided frequency signal $F_{Div}$. Accordingly, it is desired that the PFD circuit 121 operate to increase the VCO tuning frequency.

Initially at operation 1, the START signal is supplied to the first D flip-flop D1, which further produces signal tristate at a high state. As the D input of D1 is fixed at a high state, signal tri-state remains in the high state until the END signal is raised high to clear D1.

Signals $F_{Ref}$ and $F_{Div}$ are supplied to crosspoint switch SW1, the direction of which is chosen UP. As shown, the UP direction of switch SW1 correlates to a high state signal, although a low state signal may be used alternatively. In the illustrated UP state, crosspoint switch SW1 operates in a thru mode, in which $F_{Ref}$ is passed thru from the first input to the first output, and signal $F_{Div}$ passed thru from the second input to the second output.

At operation 2, the first logical AND gate L1 receives high state signals $F_{Ref}$ and tristate CP, and accordingly produces high state signal O1. As the D input of second flip-flop D2 is held high, upon receipt of the high state clock signal O1, D2 produces high state signal Q1 (operation 3). The rising edge of $F_{DIV}$ in combination with the high tristate signal produces a high state O2 signal (operation 4). A high state O2 signal clocks D3, thereby producing a high state Q2 (operation 5), which operates to clear D1 and return the tristate signal to a low level. A low tristate signal results in signals O1 and O2 returning to a low state (operation 7), and after a delay, the rising edge of $F_{Div}$ in operation 4 acts to generate a CLR signal which returns Q1 and Q2 to a low level (operation 8).

Once the tristate signal returns to a low state, the PFD circuit 121 becomes operational, and at operation 9, the rising edge of FRef operates to activate the UP signal to a high state, thereby producing an output charge signal corresponding to an increase in the VCO frequency. At operation 10, the rising edge of the $F_{Div}$ signal, after some delay, results in the output of a CLR signal. The CLR signal results in a high state DN signal which suspends increases in the VCO frequency (as both the UP and DN signals are in a high state), and subsequently the UP and DN signals return to a low state.

At operation 11, the rising edge of $F_{Ref}$ triggers the UP signal to a high state, which, in combination with the low state of the DN signal, results in the PFD circuit 110 output a charge signal to increase the VCO frequency. At operation 12, the rising edge of $F_{Div}$ generates a CLR signal, thereby activating the DN signal to a high state, suspending PFD charge output signaling to increase the VCO frequency, and the UP and DN signals return to their respective low states subsequently.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

The terms "a" or "an" are used to refer to one, or more than one feature described thereby. Furthermore, the term "coupled" or "connected" refers to features which are in communication with each other (electrically, mechanically, thermally, as the case may be), either directly, or via one or more intervening structures or substances. The sequence of operations and actions referred to in method flowcharts are exemplary, and the operations and actions may be conducted in a different sequence, as well as two or more of the operations and actions conducted concurrently. All publications, patents, and other documents referred to herein are incorporated by reference in their entirety. To the extent of any inconsistent usage between any such incorporated document and this document, usage in this document shall control.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. In a multiple frequency source system having a tunable frequency source operable to tune to a predefined target frequency, and a second frequency source operable to generate a second signal at a frequency higher than the target frequency, a method for tuning the tunable frequency source to the target frequency during concurrent generation of the second signal at the higher frequency, the method comprising:

controlling the tunable frequency source to tune to at least one frequency point lower than the target frequency; and thereafter, controlling the tunable frequency source to tune to the target frequency, wherein the tunable frequency source comprises a plurality of oscillators, each oscillator operable over a predefined range comprising a portion of the collective tuning range of the tunable frequency source, and wherein controlling the tunable frequency source to tune to at least one frequency point lower than the target frequency comprises selecting, from the plurality of oscillators, a tuning oscillator operable to tune (i) below the target frequency and (ii) to the target frequency.

2. In a multiple frequency source system having a tunable frequency source operable to tune to a predefined target frequency, and a second frequency source operable to generate a second signal at a frequency higher than the target frequency, a method for tuning the tunable frequency source to the target frequency during concurrent generation of the second signal at the higher frequency, the method comprising:

controlling the tunable frequency source to tune to at least one frequency point lower than the target frequency; and thereafter, controlling the tunable frequency source to tune to the target frequency, wherein the tunable frequency source comprises a plurality of oscillators, each oscillator operable over a predefined range comprising a portion of the collective tuning range of the tunable frequency source, and wherein controlling the tunable frequency source to tune to at least one frequency lower than the target frequency further comprises:

(i) computing at least one intermediate point located between the target frequency and a predefined lowest tuning frequency of the tunable frequency source; and (ii) tuning the tunable frequency source to the at least one intermediate point.

3. In a multiple frequency source system having a tunable frequency source operable to tune to a predefined target frequency, and a second frequency source operable to generate a second signal at a frequency higher than the target frequency, a method for tuning the tunable frequency source to the target frequency during concurrent generation of the second signal at the higher frequency, the method comprising:

controlling the tunable frequency source to tune to at least one frequency point lower than the target frequency; and thereafter, controlling the tunable frequency source to tune to the target frequency, wherein controlling the tunable frequency source to tune to at least one frequency lower than the target frequency further comprises:

(i) computing at least one intermediate point located between the target frequency and a predefined lowest tuning frequency of the tunable frequency source; and (ii) tuning the tunable frequency source to the at least one intermediate point; and wherein the at least one intermediate point is computed by the equation:

$$F_{Int} = F_{Target} - \frac{1}{\text{Overshoot}}(F_{avoid} - F_{Target})$$

where:

$F_{avoid}$ is the frequency of the second signal which is higher than the target frequency;

$F_{Target}$ is the target frequency; and

Overshoot is a predefined frequency overshoot quantity.

4. The method of claim 3, further comprising computing a subsequent intermediate point, wherein the previously-computed intermediate point $F_{Int}$ becomes the target frequency $F_{Target}$ in the equation, and a subsequent intermediate point is computed based thereon.

5. In a multiple frequency source system having a tunable frequency source operable to tune to a predefined target frequency, and a second frequency source to generate a second signal at a frequency lower than the target frequency, a method for tuning the tunable frequency source to the target frequency during concurrent generation of the second signal at the lower frequency, the method comprising:

controlling the tunable frequency source to tune to at least one frequency point higher than the target frequency; and thereafter, controlling the tunable frequency source to tune to the target frequency, wherein the tunable frequency source comprises a plurality of oscillators, each oscillator operable over a predefined range comprising a portion of the collective tuning range of the tunable frequency source, and wherein controlling the tunable frequency source to tune to at least one frequency point higher than the target frequency comprises selecting, from the plurality of oscillators, a tuning oscillator operable to tune (i) furthest above the target frequency and (ii) to the target frequency.

6. In a multiple frequency source system having a tunable frequency source operable to tune to a predefined target frequency, and a second frequency source to generate a second signal at a frequency lower than the target frequency, a method for tuning the tunable frequency source to the target frequency during concurrent generation of the second signal at the lower frequency, the method comprising:

controlling the tunable frequency source to tune to at least one frequency point higher than the target frequency; and thereafter controlling the tunable frequency source to tune to the target frequency, wherein the tunable frequency source comprises a plurality of oscillators, each oscillator operable over a predefined range comprising a portion of the collective tuning range of the tunable frequency source, and wherein controlling the tunable frequency source to tune to at least one frequency higher than the target frequency further comprises:

(i) computing at least one intermediate point located between the target frequency and a predefined highest tuning frequency of the tunable frequency source; and (ii) tuning the tunable frequency source to the at least one intermediate point.

7. The method of claim 6, wherein the at least one intermediate point is computed by the equation:

$$F_{Int} = F_{Target} + \frac{1}{\text{Overshoot}}(F_{avoid} - F_{Target})$$

where:

$F_{avoid}$ is the frequency of the second signal which is lower than the target frequency;

$F_{Target}$ further is the target frequency; and

Overshoot is a predefined frequency overshoot quantity.

8. The method of claim 7, further comprising computing a subsequent intermediate point, wherein the previously-computed intermediate point $F_{Int}$ becomes the target frequency $F_{Target}$ in the equation, and a subsequent intermediate frequency point is computed based thereon.

9. In a multiple frequency source system having a tunable frequency source operable to tune to a predefined target frequency, and at least two additional frequency sources, a first of the additional frequency sources operable to generate a low frequency signal at a frequency lower than the target frequency, and a second of the additional frequency sources operable to generate a high frequency signal at a frequency higher than the target frequency, the tunable frequency source including one or more oscillators for tuning to the target frequency, a method for tuning the tunable frequency source to the target frequency during concurrent generation of the low and high frequency signals, the method comprising:

determining a median point between the high and low frequency signals;

selecting an oscillator of the tunable frequency source for tuning to the target frequency, the selected oscillator having a tuning range which includes the median point and the target frequency, the selected oscillator having a low frequency tuning point, a midband tuning point, and a high frequency tuning point;

determining whether the median point between high and low frequency signals is located higher or lower in frequency than the midband tuning point of the selected oscillator;

selecting as a start frequency for the selected oscillator, an interpolated value of (i) the high frequency and midband tuning points of the selected oscillator, if the midband tuning point of the selected oscillator is higher than the median point between the high and low frequency signals, or (ii) the midband and low frequency tuning points of the selected oscillator, if the midband tuning point of the selected oscillator is lower than the median point between the high and low frequency signals; and controlling the selected oscillator to tune from the selected start frequency to the target frequency.

10. In a multiple frequency source system having a tunable frequency source operable to tune to a predefined target frequency, and a plurality of additional frequency sources, a first of the additional frequency sources operable to generate a low frequency signal operating at a frequency lower than the target frequency, and a second of the additional frequency sources operable to generate a high frequency signal at a frequency higher than the target frequency, the tunable frequency source including one or more oscillators for tuning to the target frequency, a method for tuning the tunable frequency source to the target frequency during concurrent generation of the high and low frequency signals, the method comprising:

identifying one or more oscillators of the tunable frequency source which have (i) a minimum tunable frequency which is lower than the low frequency signal, or (ii) a maximum tunable frequency which is higher than the high frequency signal;

selecting, from the one or more identified oscillators, an oscillator having the greatest offset, either as measured from each of the oscillators' lowest tunable frequency to the low frequency signal, or from each of the oscillators' highest tunable frequency to the high frequency signal; and controlling the selected oscillator to tune to the target frequency.

11. The method of claim 10, wherein controlling the selected oscillator comprises:

identifying an approach frequency, the approach frequency comprising a frequency which is either lower than the low frequency signal, or higher than the high frequency signal;

tuning the selected oscillator to the approach frequency; and tuning the selected oscillator to the target frequency after tuning to the approach frequency.

12. The method of claim 11, wherein the approach frequency is lower than the low frequency signal, the method further comprising:

(i) computing at least one intermediate point located between the approach frequency and a predefined lowest tuning frequency of the tunable frequency source; and (ii) prior to tuning to the approach frequency, tuning the tunable frequency source to the at least one intermediate point.

13. The method of claim 12, wherein the at least one intermediate point is computed by the equation:

$$F_{Int} = F_{Target} - \frac{1}{\text{Overshoot}}(F_{avoid} - F_{Target})$$

where:

$F_{avoid}$ is the frequency of the low frequency signal which is higher than the approach frequency;

$F_{Target}$ is the approach frequency; and

Overshoot is a predefined frequency overshoot quantity.

14. The method of claim 13, further comprising computing a subsequent intermediate point, wherein the previously-computed intermediate point $F_{Int}$ becomes the approach frequency $F_{Target}$ in the equation, and a subsequent intermediate point is computed based thereon.

15. The method of claim 11, wherein the approach frequency is higher than the high frequency signal, the method further comprising:

(i) computing at least one intermediate point located between the approach frequency and a predefined highest tuning frequency of the tunable frequency source; and (ii) prior to tuning to the approach frequency, tuning the tunable frequency source to the at least one intermediate point.

16. The method of claim 15, wherein the at least one intermediate point is computed by the equation:

$$F_{Int} = F_{Target} + \frac{1}{\text{Overshoot}}(F_{avoid} - F_{Target})$$

where:

$F_{avoid}$ is the frequency of the higher frequency signal which is lower than the approached frequency;

$F_{Target}$ is the approach frequency; and

Overshoot is a predefined frequency overshoot quantity.

17. The method of claim 16, further comprising computing a subsequent intermediate point, wherein the previously-computed intermediate point $F_{Int}$ becomes the target frequency $F_{Target}$ in the equation, and a subsequent intermediate frequency point is computed based thereon.

18. A multiple frequency source system, comprising:

a tunable frequency source operable to tune to a target frequency within a frequency spectrum of the multiple frequency source system and to tune to the target frequency during generation of a second signal; and a second frequency source operable to generate the second signal at a frequency which is lower than the target frequency within the frequency spectrum of the multiple frequency source system, wherein the second frequency source is operable to generate a low frequency signal lower than the target frequency, the system further comprising:

means for controlling the tunable frequency source to tune to at least one frequency point higher than the target frequency; and means for controlling the tunable frequency source to subsequently. tune to the target frequency.

19. The multiple frequency source system of claim 18, wherein the second frequency source is operable to generate a high frequency signal higher than the target frequency, the system further comprising: means for controlling the tunable frequency source to tune to at least one frequency point lower than the target frequency; and means for controlling the tunable frequency source to subsequently tune to the target frequency.

20. The multiple frequency source system of claim 19, wherein the means for controlling the tunable frequency source to tune to at least one frequency point lower than the target frequency comprises:

means for computing at least one intermediate point located between the target frequency and a predefined lowest tuning frequency of the tunable frequency source; and means for tuning the tunable frequency source to the at least one intermediate point.

21. The multiple frequency source system of claim 20, wherein the at least one intermediate point is computed by the equation:

$$F_{Int} = F_{Target} - \frac{1}{\text{Overshoot}}(F_{avoid} - F_{Target})$$

where:

$F_{avoid}$ is the frequency of the second signal which is higher than the target frequency;

$F_{Target}$ is the target frequency; and

Overshoot is a predefined frequency overshoot quantity.

22. The multiple frequency source system of claim 21, further comprising means for computing a subsequent intermediate point, wherein the previously-computed intermediate point $F_{Int}$ becomes the target frequency $F_{Target}$ in the equation, and a subsequent intermediate point is computed based thereon.

23. The multiple frequency source system of claim 18, wherein the means for controlling the tunable frequency source to tune to at least one frequency higher than the target frequency comprises:

means for computing at least one intermediate point located between the target frequency and a predefined highest tuning frequency of the tunable frequency source; and means for tuning the tunable frequency source to the at least one intermediate point.

24. The multiple frequency source system of claim 23, wherein the at least one intermediate point is computed by the equation:

$$F_{Int} = F_{Target} + \frac{1}{\text{Overshoot}}(F_{avoid} - F_{Target})$$

where:

$F_{avoid}$ is the frequency of the second signal which is lower than the target frequency;

$F_{Target}$ is the target frequency; and

Overshoot is a predefined frequency overshoot quantity.

25. The multiple frequency source system of claim 24, further comprising means for computing a subsequent intermediate point, wherein the previously-computed intermediate point $F_{Int}$ becomes the target frequency $F_{Target}$ in the equation, and a subsequent intermediate frequency point is computed based thereon.

26. The multiple frequency source system of claim 18, wherein the second frequency source is a fixed frequency source.

27. The multiple frequency source system of claim 18, wherein the second frequency source is a tunable frequency source.

28. The multiple frequency source system of claim 18, wherein the tunable frequency source comprises a phase locked loop circuit.

29. The multiple frequency source system of claim 28, wherein the phase locked loop comprises a loop filter, the loop filter comprising:

an operational amplifier having an inverting input, a non-inverting input, and an output; a first op-amp capacitor coupled between the inverting input and the output of the operational amplifier;

a second op-amp capacitor coupled between the non-inverting input of the operational amplifier and signal ground; and at least two of the circuits selected from the group consisting of;

(i) a low overshoot tuning circuit, comprising:

a first low overshoot tuning circuit configured to couple between the inverting input and the first op-amp capacitor; and a second low overshoot tuning circuit configured to couple between the non-inverting input and signal ground, wherein the first and second low overshoot tuning circuits are operable to provide a low overshoot filter characteristic to the phase locked loop filter;

(ii) a pre-charge circuit, comprising:

a first pre-charge circuit configured to couple across the first op-amp capacitor and operable to precharge the first op-amp capacitor;

a second pre-charge circuit configured to couple across the second op-amp capacitor and operable to pre-charge the second op-amp capacitor; and a third precharge circuit configured. to couple to the inverting and non-inverting inputs and operable to apply a predefined charging voltage thereto;

(iii) a normal tuning circuit, comprising:

a first normal tuning circuit configured to couple between the inverting input and the first op-amp capacitor; and a second normal tuning circuit configured to couple between the non-inverting input and signal ground, wherein the first and second normal tuning circuits are operable to provide a normal filter characteristic to the phase locked loop filter; and (iv) a tuning voltage measurement circuit configured to couple to the output of the operational amplifier.

30. The multiple frequency source system of claim 29, wherein one of the normal tuning, low overshoot, or pre-charge circuits is fixedly coupled to the operational amplifier, and wherein the remaining two of the normal tuning, low overshoot, and pre-charge circuits are switchably coupled to the operational amplifier.

31. The multiple frequency source system of claim 29, wherein the first and second low overshoot tuning circuits each comprise a parallel-coupled resistor and capacitor.

32. The multiple frequency source system 29, wherein the tuning voltage measurement circuit comprises a comparator having a first input coupled to the output of the operational amplifier, a second input coupled to a reference potential and an output.

33. The multiple frequency source system of claim 29, wherein the first and second pre-charge circuits each comprise a resistor, 34. The multiple frequency source system of claim 29, wherein the first and second normal tuning circuits each comprise a parallel-coupled resistor and capacitor.

35. The multiple frequency source system of claim 34, wherein the first and second low overshoot tuning circuits each comprise a parallel-coupled resistor and capacitor, and wherein the input impedance of each of the first and second low overshoot tuning circuits is greater than the input impedance of each of the first and second normal tuning circuits.

36. The multiple frequency source system of claim 35, wherein the resistors of each of the first and second low overshoot tuning circuits is at least three times higher in resistance than the resistor of each of the first and second normal tuning circuits.

37. The multiple frequency source system of claim 35, wherein the capacitors of each of the first and second low overshoot tuning circuits is at least five times higher in reactance than the capacitance of each of the first and second normal tuning circuits.

38. A computer program product, resident on a computer readable medium for operation with a multiple frequency source system having a tunable frequency source operable to tune to a predefined target frequency, and a second frequency source operable to generate a second signal at a frequency higher than the target frequency, the computer program product operable to tune the tunable frequency source to the target frequency during concurrent generation of the second signal at the higher frequency, the computer program product comprising:

instruction code to control the tunable frequency source to tune to at least one frequency point lower than the target frequency; and instruction code to thereafter control the tunable frequency source to tune to the target frequency, wherein the tunable frequency source comprises a plurality of oscillators, each oscillator operable over a predefined range comprising a portion of the collective tuning range of the tunable frequency source, and wherein the instruction code to control the tunable frequency source to tune to at least one frequency point lower than the target frequency comprises instruction code to select, from the plurality of oscillators, a tuning oscillator operable to-tune (i) furthest below the target frequency and (ii) to the target frequency.

39. A computer program product, resident on a computer readable medium for operation with a multiple frequency source system having a tunable frequency source operable to tune to a predefined target frequency, and a second frequency source to generate a second signal at a frequency lower than the target frequency, the computer program product operable to tune the tunable frequency source to the target frequency during concurrent generation of the second signal at the lower frequency, the computer program product comprising:

instruction code to control the tunable frequency source to tune to at least one frequency point higher than the target frequency; and instruction code to thereafter control the tunable frequency source to tune to the target frequency, wherein the tunable frequency source comprises a plurality of oscillators, each oscillator operable over a predefined range comprising a portion of the collective tuning range of the tunable frequency source, and wherein the instruction code to control the tunable frequency source to tune to at least one frequency point higher than the target frequency comprises instruction code to select, from the plurality of oscillators, a tuning oscillator operable to tune (i) furthest above the target frequency and (ii) to the target frequency.

40. A computer program product, resident on a computer readable medium for operation with a multiple frequency source system having a tunable frequency source operable to tune to a predefined target frequency, and at least two additional frequency sources, a first of the additional frequency sources operable to generate a low frequency signal at a frequency lower than the target frequency, and a second of the additional frequency sources operable to generate a high frequency signal at a frequency higher than the target frequency, the tunable frequency source including one or more oscillators for tuning to the target frequency, the computer program product operable to tune the tunable frequency source to the target frequency during concurrent generation of the low and high frequency signals, the computer program product comprising:

instruction code to determine a median point between the high and low frequency signals;

instruction code to select an oscillator of the tunable frequency source for tuning to the target frequency, the selected oscillator having a tuning range which includes the median point and the target frequency, the selected oscillator having a low frequency tuning point, a midband tuning point, and a high frequency tuning point;

instruction code to determine whether the median point between high and low frequency signals is located higher or lower in frequency than the midband tuning point of the selected oscillator;

instruction code to select as a start frequency for the selected oscillator, an interpolated value of (i) the high frequency and midband tuning points of the selected oscillator, if the midband tuning point of the selected oscillator is higher than the median point between the high and low frequency signals, or (ii) the midband and low frequency tuning points of the selected oscillator, if the midband tuning point of the selected oscillator is lower than the median point between the high and low frequency signals; and instruction code to control the selected oscillator to tune from the selected start frequency to the target frequency.

41. A computer program product, resident on a computer readable medium for operation with a multiple frequency source system having a tunable frequency source operable to tune to a predefined target frequency, and a plurality of additional frequency sources, a first of the additional frequency sources operable to generate a low frequency signal operating at a frequency lower than the target frequency, and a second of the additional frequency sources operable to generate a high frequency signal at a frequency higher than the target frequency, the tunable frequency source including one or more oscillators for tuning to the target frequency, the computer program product operable to tune the tunable frequency source to the target frequency during concurrent generation of the high and low frequency signals, the computer program product comprising:

instruction code to identify one or more oscillators of the tunable frequency source which have (i) a minimum tunable frequency which is lower than the low frequency signal, or (ii) a maximum tunable frequency which is higher than the high frequency signal;

instruction code to select, from the one or more identified oscillators, an oscillator having the greatest offset, either as measured from each of the oscillators' lowest tunable frequency to the low frequency signal, or from each of the oscillators' highest tunable frequency to the high frequency signal; and instruction code to control the selected oscillator to tune to the target frequency.

\* \* \* \* \*